United States Patent
Eldridge et al.

(10) Patent No.: US 6,603,324 B2
(45) Date of Patent: Aug. 5, 2003

(54) SPECIAL CONTACT POINTS FOR ACCESSING INTERNAL CIRCUITRY OF AN INTEGRATED CIRCUIT

(75) Inventors: Benjamin N. Eldridge, Danville, CA (US); Igor Y. Khandros, Orinda, CA (US); David V. Pedersen, Scotts Valley, CA (US); Ralph G. Whitten, San Jose, CA (US)

(73) Assignee: FormFactor, Inc., Livermore, CA (US)

(*) Notice: Subject to any disclaimer, the term of this patent is extended or adjusted under 35 U.S.C. 154(b) by 0 days.

(21) Appl. No.: 09/753,312

(22) Filed: Dec. 29, 2000

(65) Prior Publication Data

US 2001/0020743 A1 Sep. 13, 2001

Related U.S. Application Data

(62) Division of application No. 09/224,169, filed on Dec. 31, 1998, now Pat. No. 6,456,099.

(51) Int. Cl.[7] .................................................. G01R 31/02
(52) U.S. Cl. ....................... 324/755; 324/756; 324/158.1
(58) Field of Search ............................... 324/158.1, 754, 324/755, 756, 763; 439/70, 66, 482, 74, 68

(56) References Cited

U.S. PATENT DOCUMENTS

| | | | |
|---|---|---|---|
| 3,781,683 A | 12/1973 | Freed | |
| 3,821,645 A | 6/1974 | Vinsani | |

(List continued on next page.)

FOREIGN PATENT DOCUMENTS

| | | |
|---|---|---|
| JP | 3-65659 | 3/1991 |
| JP | 4-207047 | 7/1992 |
| JP | 5-29406 | 2/1993 |

OTHER PUBLICATIONS

Singer, "VTS 97 Keynote: The Future Of Test And DFT," Jul.–Sep. 1997, pp. 11–14.
Aigner, "Embedded At–Speed Test Probe," Jul. 1997, International Test Conference, Paper 37.1, pp. 932–937.
Mentor Graphics, "Design–For–Test Data Sheet Catalog," 1997, 21 pages.
Mentor Graphics, "Improved Design Quality Through Real Test Solutions," 1998, 31 pages.
UPSYS Reaseau Eurisys, "COBRA Probe Advanced Test Probe Technology–Innovative Qualities Devoted To The Semiconductor Industry," 1996, 4 pages.
Mann, "Southwest Test Workshop," Jun. 9–12, 1996, 10 pages.

Primary Examiner—Kamand Cueno
Assistant Examiner—Jimmy Nguyen
(74) Attorney, Agent, or Firm—N. Kenneth Burraston; Stuart L. Merkadeau

(57) ABSTRACT

One embodiment of the present invention concerns an integrated circuit that includes bond pads and special contact pads or points. The bond pads are for interfacing the integrated circuit as a whole with an external circuit, and are to be bonded to a package or circuit board. The bond pads are disposed on the die in a predetermined alignment such as a peripheral, grid, or lead-on-center alignment. The special contact pads are used to provide external test patterns to internal circuits and/or to externally monitor results from testing the internal circuits. The special contact pads may be advantageously located on the integrated circuit with a high degree of positional freedom. For one embodiment, the special contact pads may be disposed on the die at a location that is not in the same alignment as the bond pads. The special contact pads may be smaller than the bond pads so as not to increase the die size due to the special contact pads. The special contact points may also be used to externally program internal circuits (e.g., nonvolatile circuits) at the die or package level. The special contact points may also be used to select redundant circuits for faulty circuits.

20 Claims, 16 Drawing Sheets

U.S. PATENT DOCUMENTS

| | | |
|---|---|---|
| 3,842,189 A | 10/1974 | Southgate |
| 3,849,872 A | 11/1974 | Hubacher |
| 4,281,449 A | 8/1981 | Ports et al. |
| 4,523,144 A | 6/1985 | Okubo et al. |
| 4,567,433 A | 1/1986 | Ohkubo et al. |
| 4,636,722 A | 1/1987 | Ardezzone |
| 4,719,417 A | 1/1988 | Evans |
| 4,837,622 A | 6/1989 | Whann et al. |
| 4,965,865 A | 10/1990 | Trenary |
| 4,983,907 A | 1/1991 | Crowley |
| 5,012,187 A | 4/1991 | Littlebury |
| 5,055,778 A | 10/1991 | Okubo et al. |
| 5,088,190 A | 2/1992 | Malhi et al. |
| 5,103,557 A | 4/1992 | Leedy |
| 5,106,309 A | 4/1992 | Matsuoka et al. |
| 5,123,850 A | 6/1992 | Elder et al. |
| 5,124,639 A | 6/1992 | Carlin et al. |
| 5,124,646 A | 6/1992 | Shiraishi |
| 5,172,050 A | 12/1992 | Swapp |
| 5,194,932 A | 3/1993 | Kurisu |
| 5,279,975 A | 1/1994 | Devereaux et al. |
| 5,373,231 A | 12/1994 | Boll et al. |
| 5,395,253 A | 3/1995 | Crumly |
| 5,399,982 A | 3/1995 | Driller et al. |
| 5,404,099 A | 4/1995 | Sahara |
| 5,406,210 A | 4/1995 | Pedder |
| 5,418,471 A | 5/1995 | Kardos |
| 5,422,574 A | 6/1995 | Kister |
| 5,437,556 A | 8/1995 | Bargain et al. |
| 5,440,231 A | 8/1995 | Sugai |
| 5,442,282 A | 8/1995 | Rostoker et al. |
| 5,476,211 A | 12/1995 | Khandros |
| 5,491,426 A | 2/1996 | Small |
| 5,497,079 A | 3/1996 | Yamada et al. |
| 5,506,499 A | 4/1996 | Puar |
| 5,521,518 A | 5/1996 | Higgins |
| 5,525,545 A | 6/1996 | Grube et al. |
| 5,539,325 A | 7/1996 | Rostoker et al. |
| 5,541,525 A | 7/1996 | Wood et al. |
| 5,554,940 A | 9/1996 | Hubacher |
| 5,555,422 A | 9/1996 | Nakano |
| 5,573,435 A | 11/1996 | Grabbe et al. |
| 5,613,861 A | 3/1997 | Smith et al. |
| 5,629,137 A | 5/1997 | Leedy |
| 5,648,661 A | 7/1997 | Rostoker et al. |
| 5,677,566 A | 10/1997 | King et al. |
| 5,682,064 A | 10/1997 | Atkins et al. |
| 5,713,744 A | 2/1998 | Laub |
| 5,714,803 A | 2/1998 | Queyssac |
| 5,729,150 A | 3/1998 | Schwindt |
| 5,742,170 A | 4/1998 | Isaac et al. |
| 5,764,072 A * | 6/1998 | Kister ........................ 324/754 |
| 5,772,451 A * | 6/1998 | Doziet et al. .................. 439/70 |
| 5,783,461 A | 7/1998 | Hembree |
| 5,786,701 A | 7/1998 | Pedder |
| 5,789,930 A | 8/1998 | Isaacs et al. |
| 5,807,104 A | 9/1998 | Ikeya et al. |
| 5,828,226 A | 10/1998 | Higgins et al. |
| 5,838,163 A | 11/1998 | Rostoker et al. |
| 5,863,814 A | 1/1999 | Alcoe et al. |
| 5,899,703 A | 5/1999 | Kalter et al. |
| 5,917,707 A | 6/1999 | Khandros et al. |
| 5,923,178 A | 7/1999 | Higgins et al. |
| 5,932,891 A | 8/1999 | Higashi et al. |
| 5,974,662 A * | 11/1999 | Eldridge et al. ............. 324/761 |
| 5,983,493 A * | 11/1999 | Eldridge et al. ............. 324/754 |
| 5,998,228 A * | 12/1999 | Eldridge et al. ............. 324/754 |
| 5,998,864 A | 12/1999 | Khandros et al. |
| 6,002,266 A | 12/1999 | Briggs et al. |
| 6,008,061 A | 12/1999 | Kasai |
| 6,022,750 A | 2/2000 | Akram et al. |
| 6,023,103 A | 2/2000 | Chang et al. |
| 6,031,282 A | 2/2000 | Jones et al. |
| 6,050,829 A | 4/2000 | Eldridge et al. |
| 6,054,334 A | 4/2000 | Ma |
| 6,064,213 A * | 5/2000 | Khandros et al. ............ 324/754 |
| 6,078,083 A | 6/2000 | Amerasekera et al. |
| 6,080,604 A | 6/2000 | Waki |
| 6,107,111 A | 8/2000 | Manning |
| 6,150,827 A | 11/2000 | Pavoni et al. |
| 6,204,074 B1 | 3/2001 | Bertolet et al. |
| 6,211,541 B1 | 4/2001 | Carroll et al. |
| 6,215,454 B1 | 4/2001 | Tran |
| 6,240,535 B1 | 5/2001 | Farnworth et al. |
| 6,246,250 B1 | 6/2001 | Doherty et al. |
| 6,310,483 B1 | 10/2001 | Taura et al. |
| 6,373,143 B1 | 4/2002 | Bell |
| 6,383,822 B1 | 5/2002 | Sprayberry et al. |
| 6,411,485 B1 | 6/2002 | Chen et al. |
| 6,429,029 B1 | 8/2002 | Eldridge et al. |
| 6,445,001 B2 | 9/2002 | Yoshida |

* cited by examiner

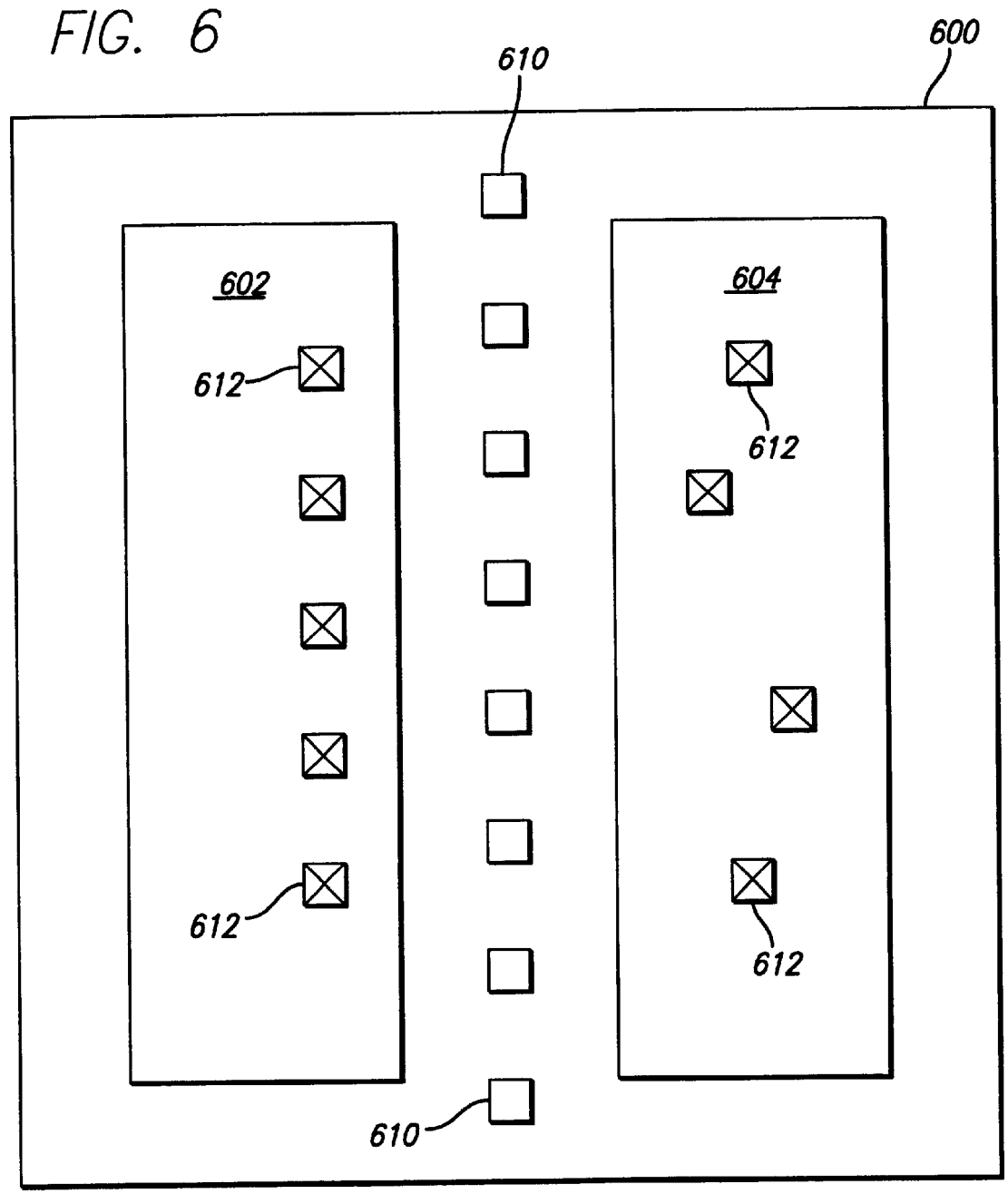

FIG. 15
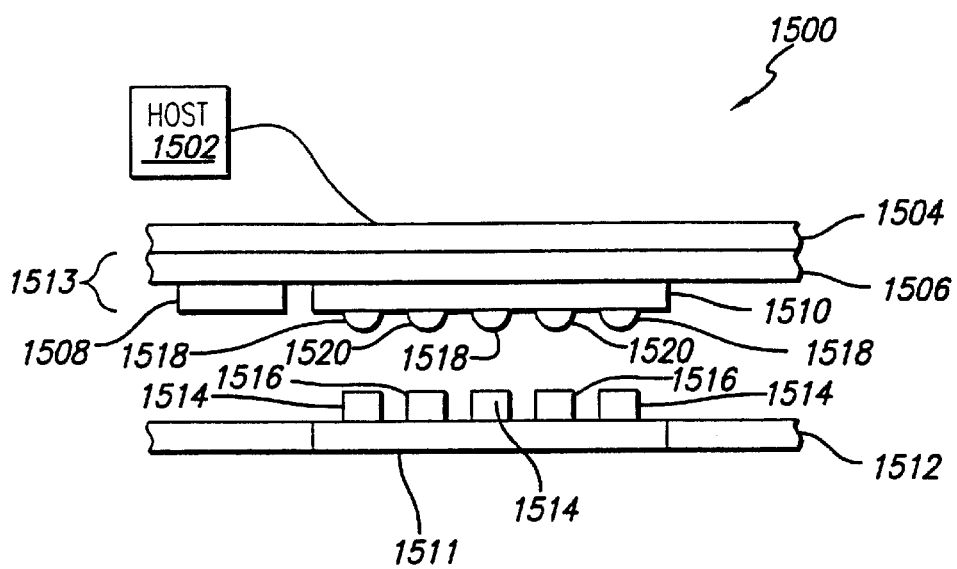
FIG. 16
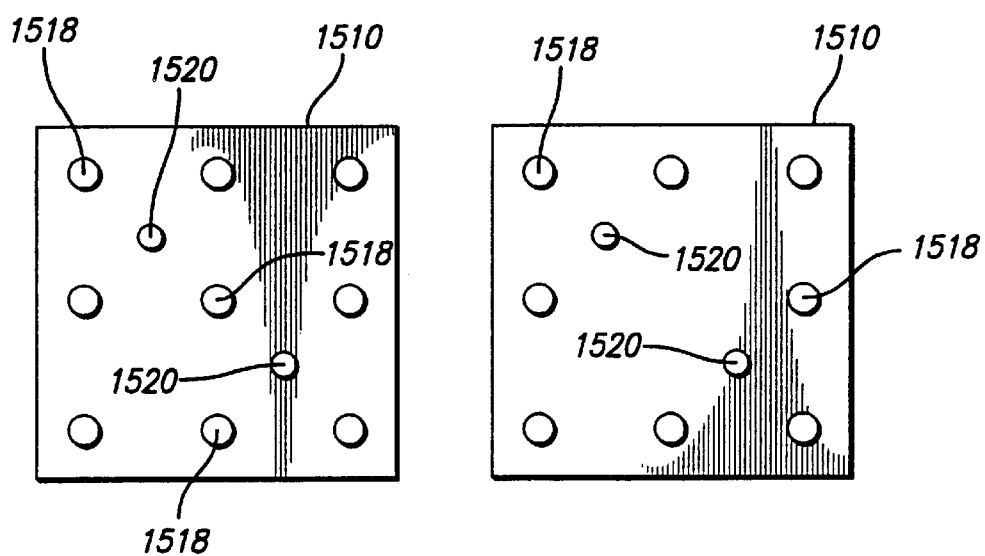
FIG. 17

FIG. 18
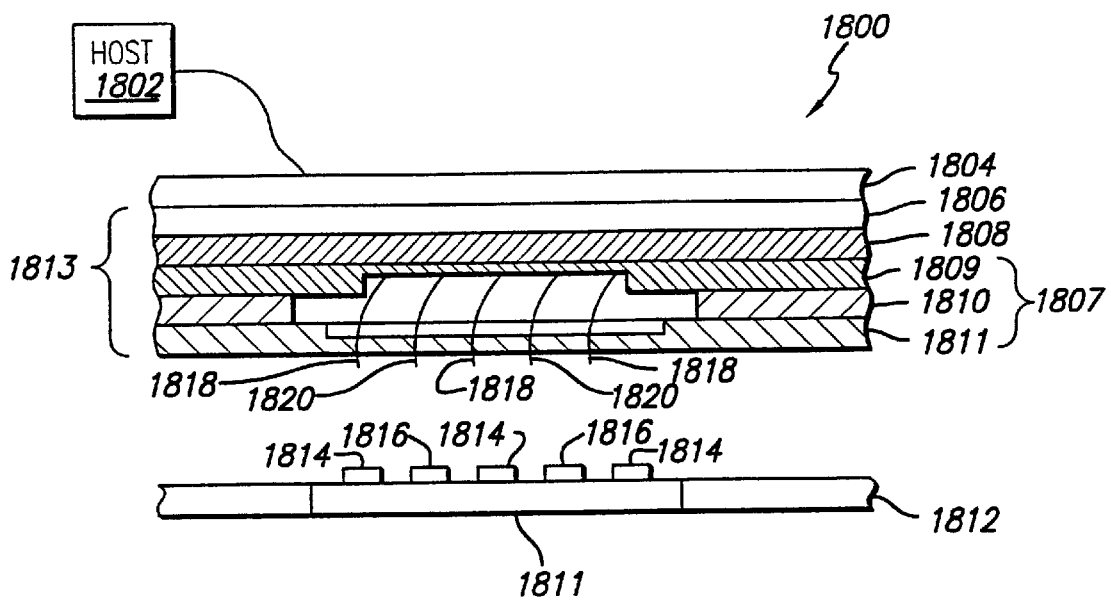
FIG. 19
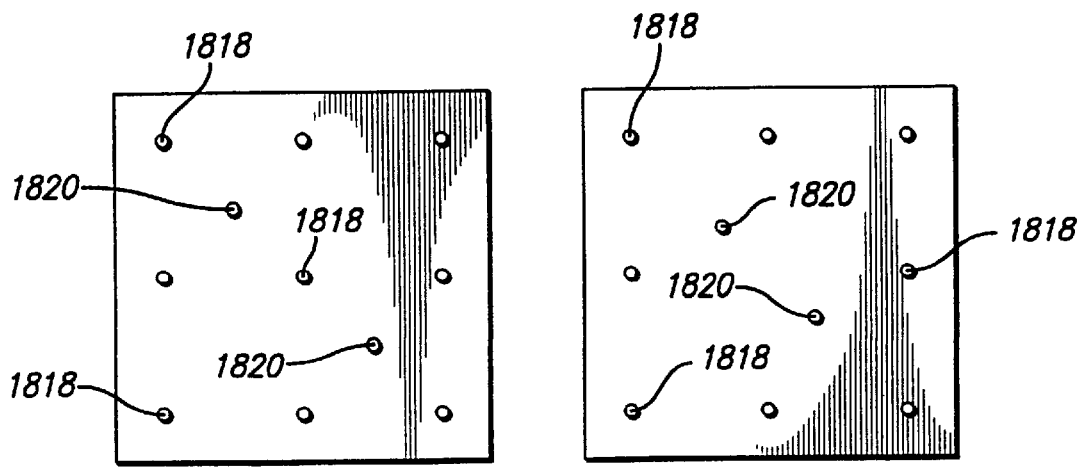
FIG. 20

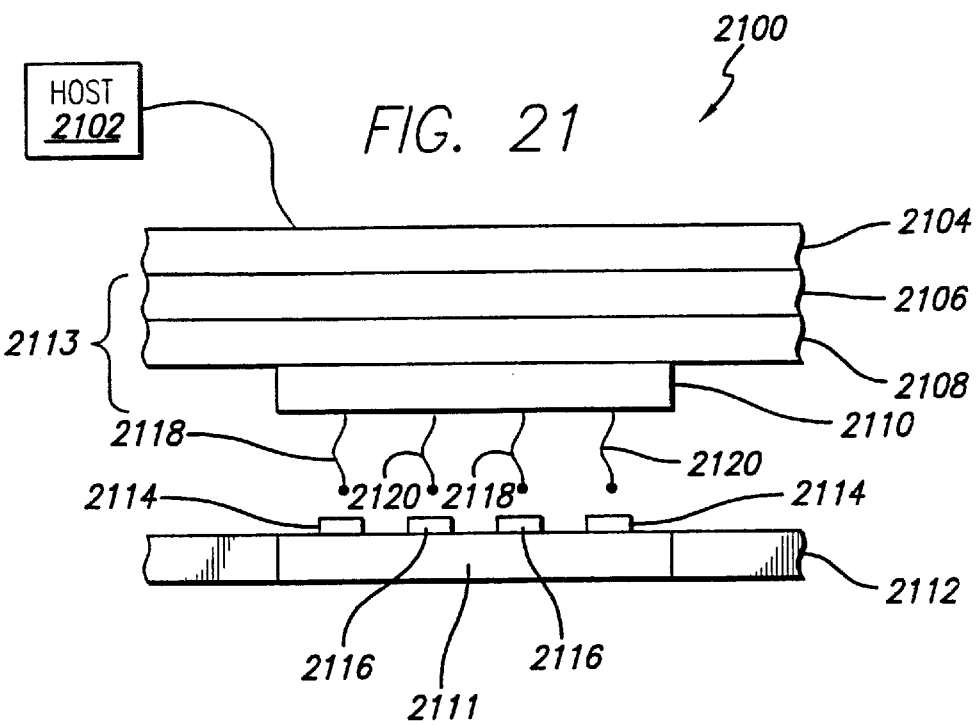
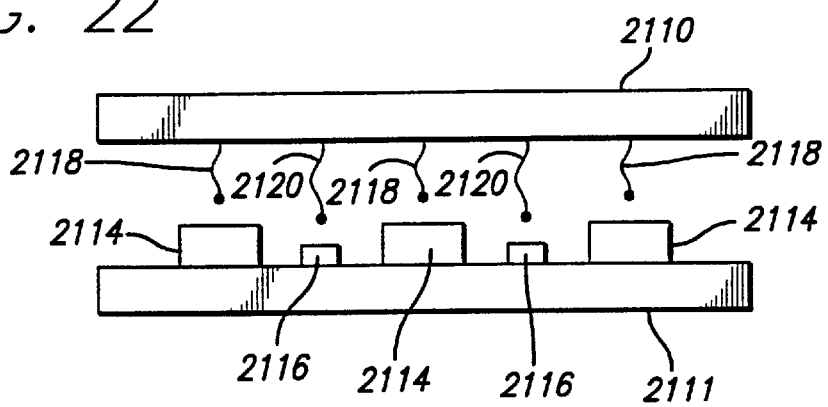
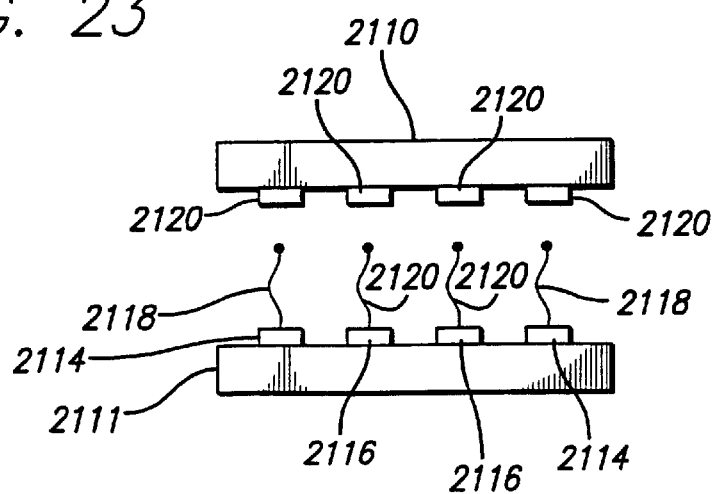

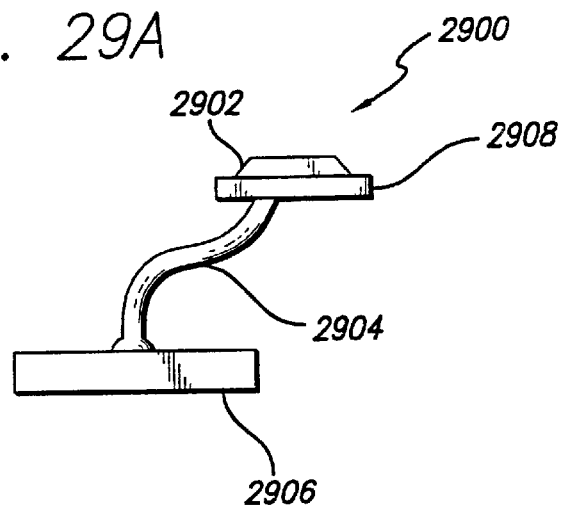
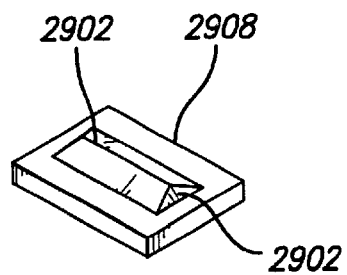
FIG. 29A  FIG. 29B
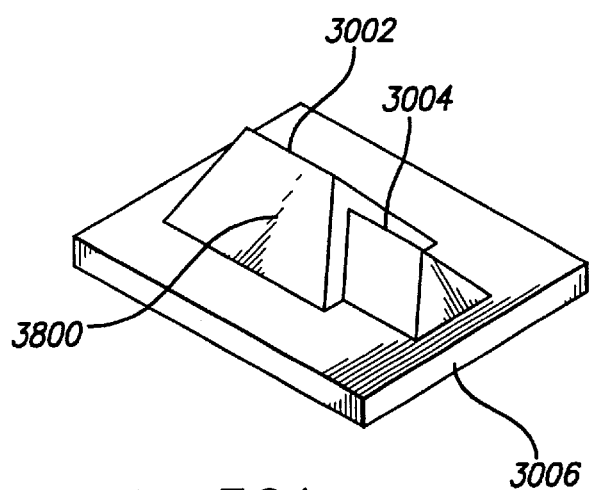
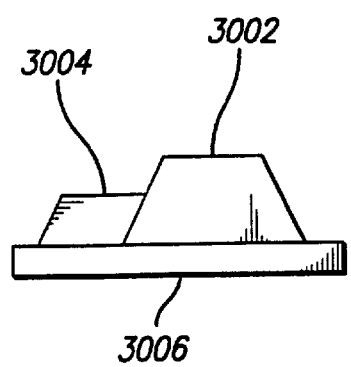
FIG. 30A  FIG. 30B
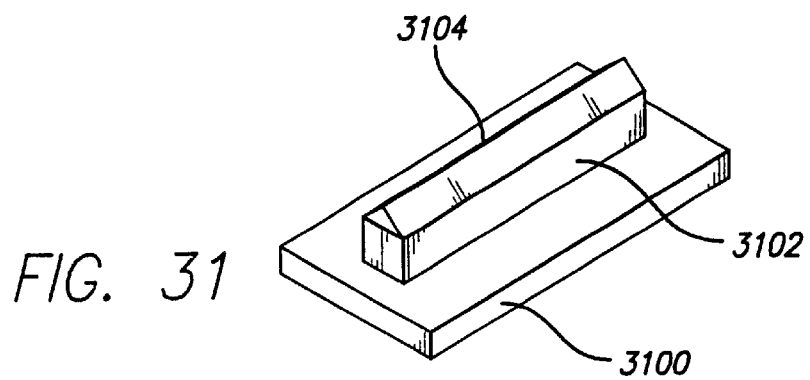
FIG. 31

SPECIAL CONTACT POINTS FOR ACCESSING INTERNAL CIRCUITRY OF AN INTEGRATED CIRCUIT

This is a divisional application of Ser. No. 09/224,169, filed Dec. 31, 1998 now U.S. Pat. No. 6,456,099.

FIELD OF THE INVENTION

The present invention relates to integrated circuit (IC) semiconductor devices and, more particularly, to testing the devices.

BACKGROUND

Large numbers of identical integrated circuits such as microprocessors, memory devices, and digital signal processing devices are generally fabricated on a silicon wafer. Due to defects that may occur during fabrication, each IC (die) on the wafer is typically tested or sorted by test equipment such as automatic test equipment (ATE) machines and probe cards. The test signals are provided to each die through input or input/output (I/O) bond pads on each die, and the test results are monitored on output or I/O bond pads. The good die that pass the wafer-level test are then singulated and packaged typically by electrically connecting the bond pads to the package by means of bond wires, solder balls, or other contact structures. To accommodate the bonding wires or solder balls, the bond pads are generally very large relative to the circuit elements of the integrated circuit. Typical bond pad sizes are on the order of 100 $\mu$m (microns)×100 $\mu$m (4 mils×4 mils). The bond pads are also typically aligned in regular patterns such as peripherally along the outside perimeter of the die, in a grid pattern, or in a column or row generally through the center of the die (lead-on-center).

The bond pads allow each die as a whole to be functionally tested for specified timing parameters (AC parameters), DC parameters, and overall operation. The bonding pads may also be used to load test patterns and monitor test result from on-chip test circuits such as SCAN circuitry and Built-In Self-Test (BIST) circuitry. The on-chip test circuits enhance the overall testing of a die by enabling individual testing of internal circuits or nodes. However, this comes at the expense of increasing the size of the die to accommodate the added test circuitry and additional bond pads needed to support the on-chip test circuitry.

If a die already has all of its peripheral, grid, or lead-on-center bond pad locations dedicated to a device function, then adding additional bond pads in the predetermined bond pad alignment to support the on-chip testing circuitry can result in a substantial increase in the size of the die. Generally, larger die are more prone to defects and consequently more expensive to manufacture. Additionally, on-chip testing circuitry can result in a significant increase in test time as many clock cycles may be required to load test input data and subsequently output test results from a few available bond pads. On-chip testing circuitry also does not allow for direct external access to internal circuit nodes. Test input data and test results must pass through the SCAN circuitry or BIST circuitry before it can be monitored. This introduces additional circuits that can mask failures in the circuit intended to be tested, or can introduce new failures caused by SCAN or BIST circuitry.

Additionally, many designs are I/O limited since only a limited number of leads (e.g., bond wires) may be accommodated in a given packaging scheme. Moreover, to test I/O functionality of a chip, these same lead locations must be used. It would be advantageous to access more points in a circuit, especially for testing. It would also be advantageous if the access points could be located with a high degree of positional freedom. Small size, large number, and arbitrary or selected positioning of the access points would also be advantageous.

SUMMARY OF THE INVENTION

One embodiment of the present invention concerns an integrated circuit that includes bond pads and special contact pads or points. The bond pads are for interfacing the integrated circuit as a whole with an external circuit, and are to be bonded to a package or circuit board. The bond pads are disposed on the die in a predetermined alignment such as a peripheral, grid, or lead-on-center alignment. The special contact pads are used to provide external test patterns to internal circuits and/or to externally monitor results from testing the internal circuits. The special contact pads may be advantageously located on the integrated circuit with a high degree of positional freedom. For one embodiment, the special contact pads may be disposed on the die at a location that is not in the same alignment as the bond pads. The special contact pads may be smaller than the bond pads so as not to increase the die size due to the special contact pads. The special contact points may also be used to externally program internal circuits (e.g., nonvolatile circuits) at the die or package level. The special contact points may also be used to select redundant circuits for faulty circuits.

Other objects, features, and advantages of the present invention will be apparent from the accompanying drawings and from the detailed description which follows below.

BRIEF DESCRIPTION OF THE DRAWINGS

The features and advantages of the present invention are illustrated by way of example and are by no means intended to limit the scope of the present invention to the particular embodiments shown, and in which:

FIG. 6 is a plan view of one embodiment of an integrated circuit having lead-on-center bond pads, internal circuitry, and special contact pads for testing the internal circuitry;

FIG. 15 is a side cross-sectional view of one embodiment of a probe card assembly having a membrane probe card with contacts for probing bond pads and special contact pads of an integrated circuit;

FIG. 16 is a plan view of the membrane probe card of FIG. 15 having conta aligned in a grid pattern for contacting bond pads, and having contact balls not aligned in the grid pattern for contacting special contact pads;

FIG. 17 is a plan view of the membrane probe card of FIG. 15 having contact balls aligned in a peripheral pattern for contacting bond pads, and having contact balls not aligned in the peripheral patten for contacting special contact pads;

FIG. 18 is a side cross-sectional view of another embodiment of a probe card assembly having a COBRA-style probe card assembly with probes for probing bond pads and special contact pads of an integrated circuit;

FIG. 19 is a plan view of the COBRA-style probe tips of FIG. 18 having some tips aligned in a grid pattern to contact bond pads, and having other tips not aligned in the grid pattern to contact special contact pads;

FIG. 20 is a plan view of the COBRA-style probe tips of FIG. 18 having some tips aligned in a peripheral pattern to contact bond pads, and having other tips not aligned in the peripheral pattern to contact special contact pads;

FIG. 21 is a side cross-sectional view of one embodiment of a probe card assembly having spring contact elements for probing bond pads and special contact pads of an integrated circuit;

FIG. 22 is another embodiment of the probe card assembly of FIG. 21 in which the spring contact elements, the bond pads, and the special contact pads have varying heights;

FIG. 23 is another embodiment of the probe card assembly of FIG. 21 in which the spring contact elements are disposed on the integrated circuit;

FIG. 29A is a side cross-sectional view of another embodiment of a spring contact element;

FIG. 29B is a perspective view of the spring contact element of FIG. 29A;

FIG. 30A is a perspective view of another embodiment of a spring contact element;

FIG. 30B is a side cross-sectional view of the spring contact element of FIG. 30A; and FIG. 31 is a perspective view of another embodiment of a tip structure for a spring contact element.

DETAILED DESCRIPTION

Figure 1:
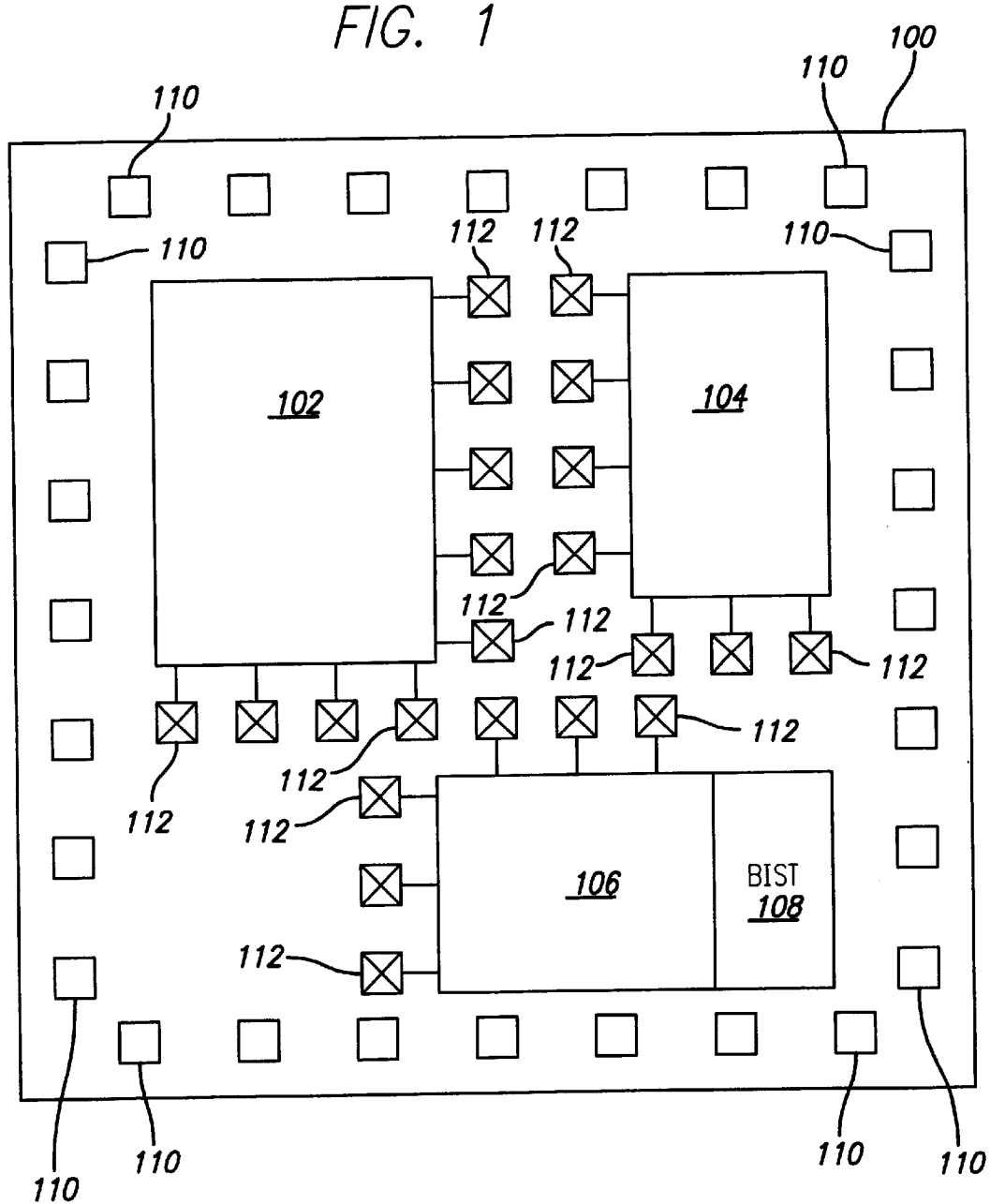
FIG. 1 is a plan view of one embodiment of an integrated circuit having peripheral bond pads, internal circuitry, and special contact pads disposed about internal circuitry and for testing the internal circuitry.

FIG. 1 shows an integrated circuit or die 100 that includes bond pads 110, special contact pads 112, and internal circuits 102, 104, 106 and 108. Internal circuits 102–106 may be any circuit blocks such as memory, control logic, programmable logic, and the like. Bond pads 110 are conventional input, output, or I/O pads for electrically interfacing internal circuits 102–108 with circuits external to integrated circuit 100. Bond pads 110 are peripherally disposed about the perimeter of integrated circuit 100, and are typically large enough to accommodate a probe tip of a probe of wafer sort probe card, a bond wire, or a solder ball.

Special contact pads 112 provide a means for providing test input data to, and monitor signals from, internal circuits 102–106 without having to test the function of the entire integrated circuit. Special contact pads 112 also provide a means for testing internal circuits 102–106 when these circuits are not otherwise individually testable and/or accessible through bond pads 110. For one example, internal circuit 102 may be an embedded memory that is not directly accessible through bond pads 110. Address and input data signals may be provided over several of the special contact pads 112 to provide test patterns to the embedded memory, and another group of special contact pads 112 may receive data read from the memory. The external circuitry providing the test patterns for the embedded memory may provide any number of patterns to increase the fault coverage.

For another embodiment, internal circuit 102 may be a programmable circuit such as nonvolatile memory or programmable logic. Data can be programmed into the internal circuit through the special contact pads 112. For example, BIOS information, program code, and system software may be programmed or updated in programmable circuit 102 after fabrication of integrated circuit 100.

On-chip test circuitry such as SCAN and BIST circuitry may not be required in integrated circuit 100 as test stimuli for integrated circuits 102–106 may be provided directly to special contact pads 112. Additionally, test results may be output to special contact pads 112 rather than bond pads 110. The external test circuitry supplying the test stimuli may provide an increased number of tests without impacting the size of integrated circuit 100. Without SCAN or BIST circuitry included in a test input or output signal path, the likelihood of more accurately determining the location of a failure increases as there is no on-chip test circuitry to mask the failure or to introduce further failures. Additionally, speed parameters or the timing of signals into and out of a circuit block or a circuit node may be more accurately measured and monitored without introducing delays caused by intermediary on-chip test circuitry.

As shown in integrated circuit 100, special contact pads 112 may also work with BIST circuitry 108 (or other on-chip test circuitry) to monitor the response of internal circuit 106 to test stimuli provided by BIST 108. This can be accomplished without having to add additional bond pads 110, or to use existing bond pads 110 to communicate with BIST 108.

As shown in FIG. 1, special contact pads 112 are disposed within a region surrounded by peripheral bond pads 110. As special contact pads 112 are not disposed in the predetermined peripheral alignment of bond pads 110, the size of integrated circuit 100 may not be increased by adding special contact pads 112. For other embodiments, the number and placement of special contact pads 112 may increase the size of integrated circuit 100.

Special contact pads 112 may also be interspersed between bond pads 110 (e.g., see FIG. 5), or be located outside the region surrounded by bond pads 110. For one embodiment in which special contact pads 112 are interspersed between bond pads 110, it may be advantageous for special contact pads 112 to be smaller than bond pads 110 so as not to increase the size of integrated circuit 100.

Special contact pads 112 may be any size including sizes smaller than bond pads 110. When special contacts 112 are smaller than bond pads 110, more special test pads may be disposed on integrated circuit 100 without increasing the size of the die over that defined by the peripheral bond pads 110. A larger number of special contact pads may increase the number and/or complexity of tests that can be provided to the internal circuit, and thus may increase the fault coverage and robustness of tests. For one embodiment, a bond pad 110 may be approximately 100 $\mu$m×100 $\mu$m, and a special contact pad may be approximately 5 to 10 $\mu$m per side. In other embodiments, the special contact pad may be less than 5 $\mu$m per side. For still other embodiments, the special contact pads may be manufactured to have different sizes to accommodate their different spatial locations on the die (e.g., between bond pads 110 vs. within the area surrounded by bond pads 110), to accommodate different dimensions of various probe tips, bond wires, or solder balls, or to accommodate different functions of the circuits under test (i.e., nodes driving output signals may required larger pads than pads for providing input signals, or vice versa). The lower limit for the size of the special contact pads may be limited by the accuracy of the probe-to-pad alignment and the size of the probe.

Special contact pads 112 may be formed into an approximately square shape, rectangular shape, or any other geometric shape. Special contact pad 112 may also have different heights than bond pads 110. Special contacts pads 112 may be fabricated using conventional photolithography proesses that are typically used to create bond pads or other, relatively flat, conductive landings. For one embodiment, the special contact pads may be fabricated from one or more metal layers including aluminum, copper, gold, or other metals or conductive materials.

Figure 2:
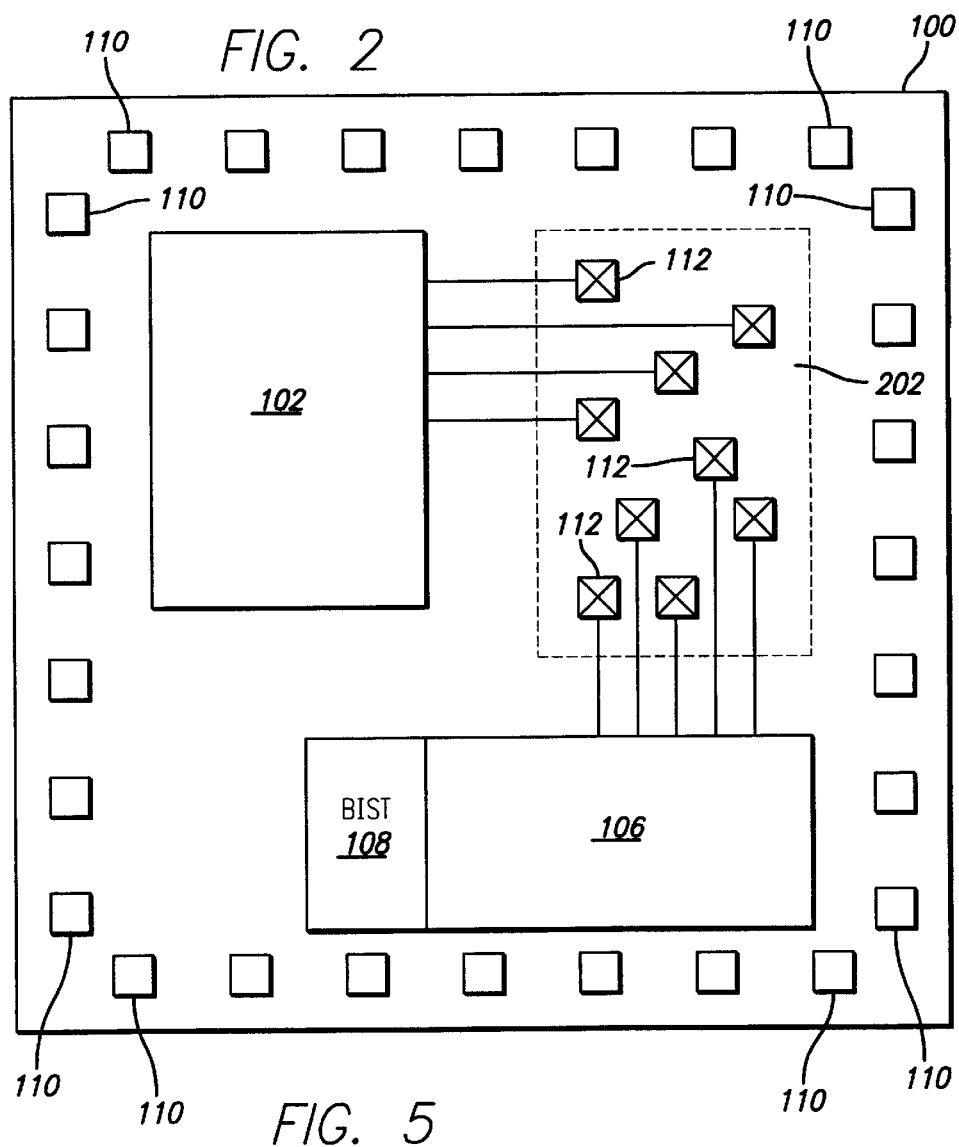
FIG. 2 is a plan view of one embodiment of an integrated circuit having peripheral bond pads, internal circuitry, and special contact pads collectively disposed in a separate region of the integrated circuit.

Integrated circuit 100 shows that special contact pads 112 are logically disposed about the circuit block which they test. In alternative embodiments, special contact pads 112 may be physically located at any other location in integrated circuit 100. FIG. 2 shows that special contact pads 112 need not be logically disposed about internal circuits 102 and 106, but may be physically located in region 202. For alternative embodiments, the special contact pads 112 may be located in any area of integrated circuit 100.

Figure 3A:
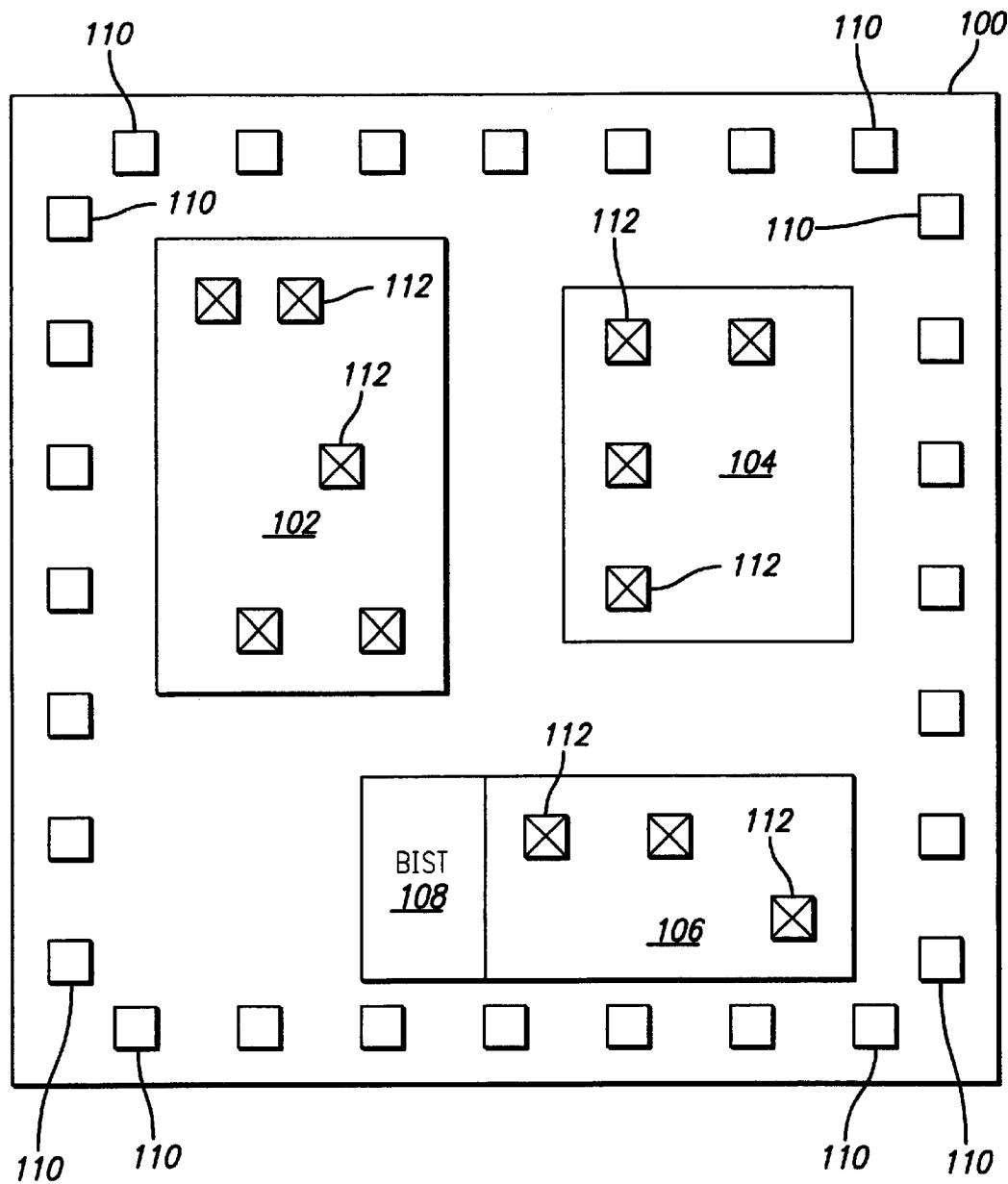
FIG. 3A is a plan view of one embodiment of an integrated circuit, internal circuitry, and special contact pads disposed over the internal circuitry.

FIGS. 1 and 2 show that special contact pads 112 may be used to test or monitor signals from an internal circuit block. FIG. 3A shows that the special contact pads may also be disposed directly over internal circuits 102–106 to monitor or excite a particular circuit node within an internal circuit block. For example, a speed critical path within an embedded memory block or other circuit may be monitored. Alternatively, the voltage level on an internal circuit node or of an internally generated reference voltage source may be monitored.

Figure 3B:
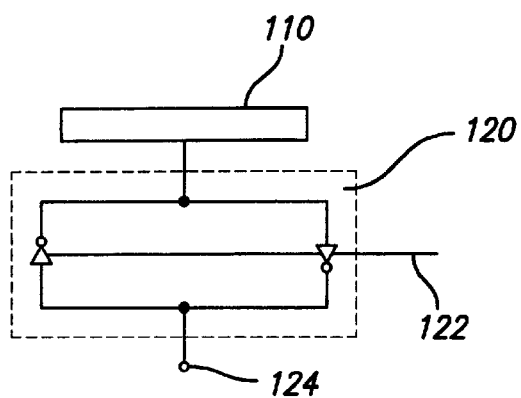
FIG. 3B is a logic diagram of one embodiment of a special contact pad coupled to an internal circuit node via a bi-directional buffer.

Special contact pads 112 may not be permanently bonded out to a integrated circuit package (e.g., typical plastic and ceramic chip packages), rather, the special contact pads may be used for receiving test input information (e.g., address, control, or data) or monitoring internal test nodes or signals. The special contact pads are large enough, however, to receive an electrical contact element (as will be described in more detail below). Given that special contact pads 112 are generally not bonded out to a package, special contacts pads 112 may require significantly less supporting circuitry than is typically required by bond pads 110. Typical bond pads generally include supporting circuitry that requires significant amounts of silicon die are. Examples of supporting circuitry include electrostatic-discharge (ESD) protection structures such as resistors, capacitors, and/or diodes, latch-up prevention circuits such as guard rings, buffers for driving circuits and signal lines external to the integrated device or for buffering internal signals received from external signal lines, logic or voltage translation circuits, and noise reduction circuitry. Special contact pads 112 may reduce the amount of supporting circuitry required. Little no ESD protection may be needed and little or no buffering may be required for an external probe to electrically contact a special contact pad and monitor a signal thereon. For one example, an I/O buffer 120 may be used between an internal test point 124 and a special contact pad 110 as shown in FIG. 3B. The I/O buffer may be controlled by a control signal 122. The I/O buffer 120 may be approximately 10 to 100 times weaker than that required for a bond pad having to drive heavy loads in a PCB environment. Additionally, little or no latch-up supporting circuitry or noise reduction circuitry may be required. For example, a weak pull-up resistor may be all that is required for each special contact pad for noise reduction circuitry. Generally, a special contact pad may require only 1 to 50 percent of the supporting circuitry typically required for a bond pad.

Figure 4:
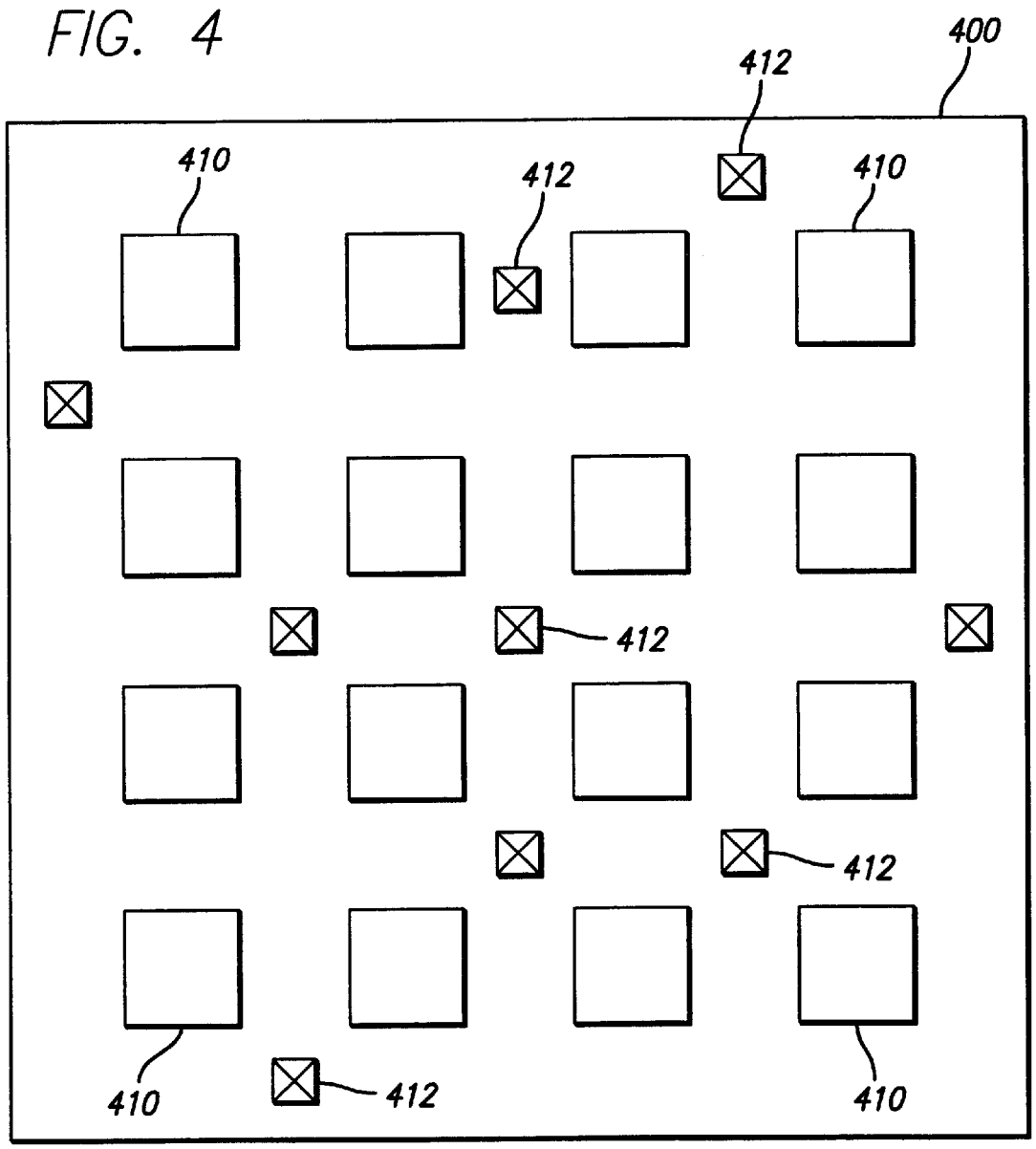
FIG. 4 is a plan view of one embodiment of an integrated circuit having bond pads aligned in a grid pattern, special contact pads not aligned in the grid pattern, and special contact pads aligned in the grid pattern.

FIG. 4 shows an integrated circuit 400 that includes bond pads 410 aligned in a Land Grid Array (LGA) pattern for bonding to contact balls (e.g., solder or other metal interconnect) in a control collapse chip connection (C4) or flip-chip arrangement. Selectively dispersed within and outside of the grid pattern are special contact pads 412 that, as in FIGS. 1–3, may be used to provide test signals to or monitor signals from internal circuits of integrated circuit 400. In this embodiment, special contact pads 412 may be smaller than the bond pads or contact balls so as not to increase the size of integrated circuit 400 over the minimum size required for a given number of bond pads 410. In alternative embodiments, the special contact pads 412 may be the same size as bond pads 410.

Figure 5:
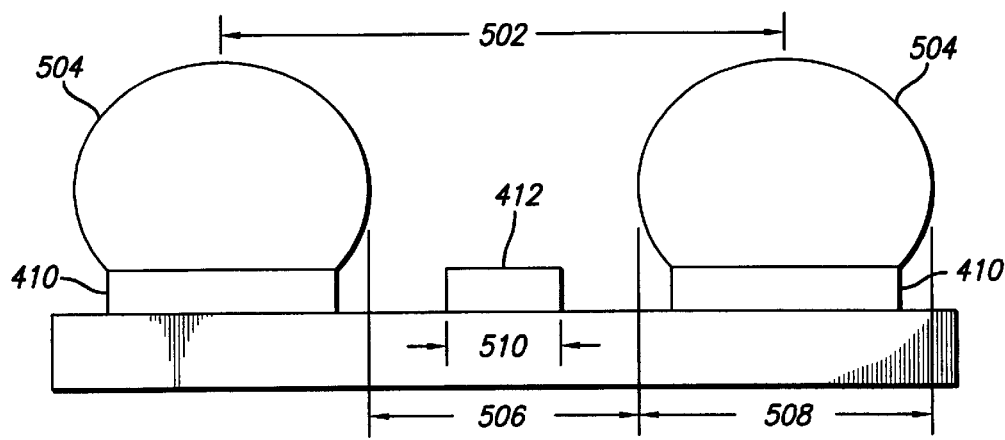
FIG. 5 is a side cross-sectional view of a special contact pads disposed between two bond pads.

FIG. 5 shows a side cross-sectional view of a special contact pad 412 disposed between two bond pads 410. Bond pads 410 have contact balls 504 formed thereon, and are typically spaced with a minimum pitch 502 between their centers of approximately 10 mils (0.010") or 250 $\mu$m. The minimum diameter 508 of the contact balls 504 is typically on the order of the 1 to 3 mils, and the minimum distance 506 between the edges of contact balls 504 is typically on the order of 7 to 9 mils. Special contact pad 412 can be sized to fit between bond pads 410, and may have a width 510 of less than 9 mils. For other embodiments, special contact pad 412 may have a width of approximately 1 to 5 mils. For still other embodiments, special contact pad 412 may have a width of less than 1 mil. Special contact pad 412 may be formed into an approximately square shape, rectangular shape, or any other geometric shape. Special contact pad 412 may also have a height different than that of bond pads 410.

For an alternative embodiment, contact balls 504 need not be formed on bond pads 410.

The embodiments shown in FIGS. 4 and 5 may also be a LGA package such as Ball Grid Array (BGA) package, Pin Grid Array (PGA) package, C4 package, or flip chip package that has pins or contact balls 410 for interfacing with a socket or printed circuit board (PCB). Special contact pads 412 may be additional pins or pads that can receive test signals or provide test output signals or other signals to probes, a socket, or PCB.

FIG. 5 also illustrates a special contact pad 412 disposed between two bond pads 410 arranged in a peripheral alignment (as shown in FIG. 1).

FIG. 6 shows an integrated circuit 600 that includes bond pads 610 arranged as a column (or row) in a lead-on-center pattern. Selectively dispersed within and outside of the lead-on-center pattern are special contact pads 612 that, as in FIGS. 1–5, may be used to provide test signals to or monitor signals from internal circuits 602 and 604 of integrated circuit 600.

Figure 7:
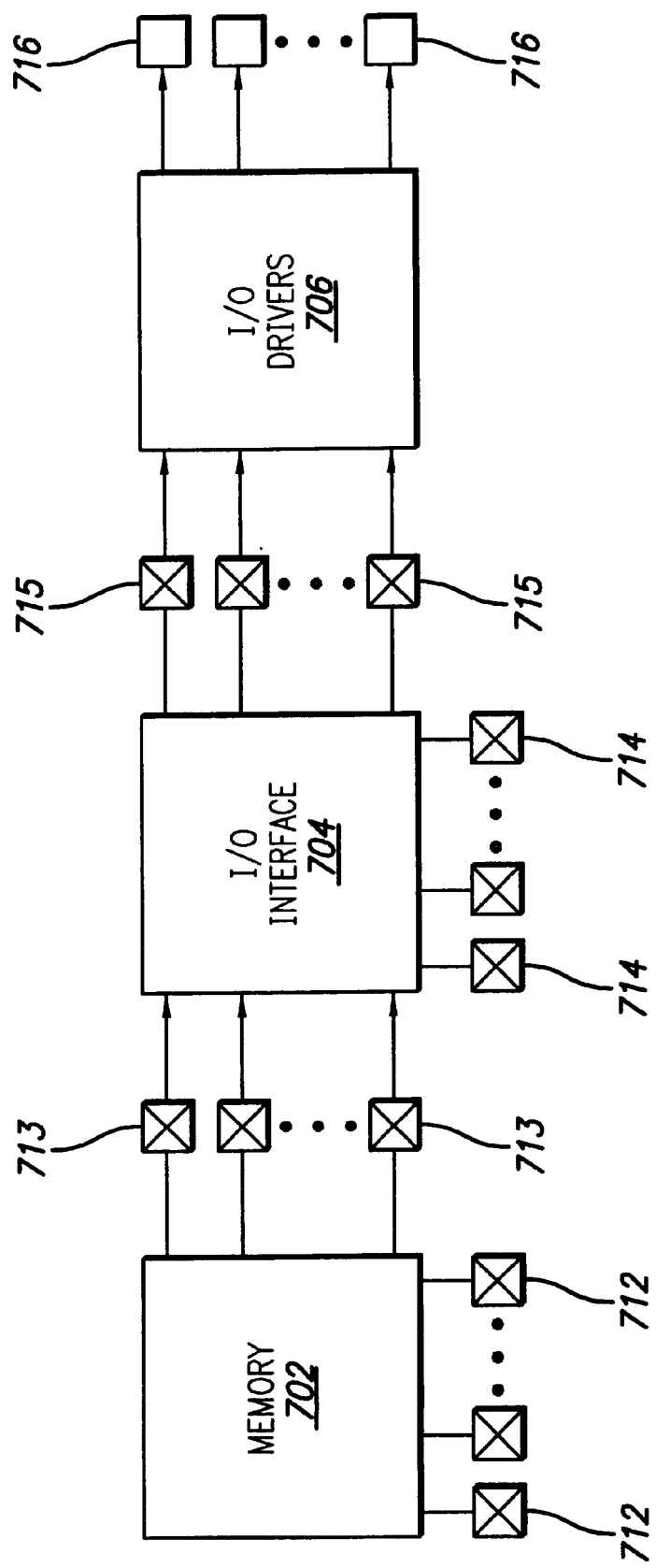
FIG. 7 is block diagram of one embodiment of sequential circuit blocks and special contact pads for testing the sequential circuits.

FIGS. 1–6 show that internal circuit blocks or circuit nodes can be tested or monitored by special contact pads. FIG. 7 shows that sequential internal circuit blocks 702, 704, and 706 can also be tested by special contact pads with or without the use of bond pads. In this embodiment, test input data is provided on special contact pads 712 to an embedded memory 702. For an alternative embodiment, the input data can be provided from bond pads. The test data may include an address, control signals (e.g., read, write, etc.), and/or a test pattern. Assuming that the test data is an address of a location within memory 702, data stored at the accessed address may be provided to I/O interface 704 and monitored by special contact pads 713. The access time (i.e., address to data out) of memory 702 may be more accurately measured by special contact pads 712 and 713 as no additional time is introduced due to circuit blocks such as I/O interface 704 and I/O drivers 706. Conventional approaches of using BIST circuitry would typically include additional on-chip circuitry to provide address signals, for example, to memory 702, and then external circuitry could monitor the results at one or more of bond pads 716. This conventional approach, however, would be unable to monitor the outputs of memory 702 directly (as with special contact pads 713) and thus would not be able to directly measure the actual access time of memory 702.

In response to the data read from memory 702, I/O interface 704 may format the data prior to providing it to I/O drivers 706. I/O interface 704 may receive control signals on special contact pads 714, or internal circuit nodes within I/O interface 704 may be monitored by special contact pads 714. The data output by I/O interface 704 to I/O drivers 706 may be monitored via special contact pads 715. I/O drivers 706 may then drive the data to bond pads 716.

Since special contact pads 713 and 715 and bond pads 716 may be used to monitor the output of each of memory 702, I/O interface 704, and I/O divers 706, respectively, such that incorrect data received at bond pads 716 can be isolated to the circuit which caused the failure. In conventional BIST techniques in which an address, for example, is provided to memory 702, the source of incorrect data received at bond pads 716 would be unknown.

While the embodiment shown in FIG. 7 includes a specific example of accessing data in an embedded memory 702, the example also applies to introducing and monitoring signals from a series of any other circuit blocks.

Figure 8:
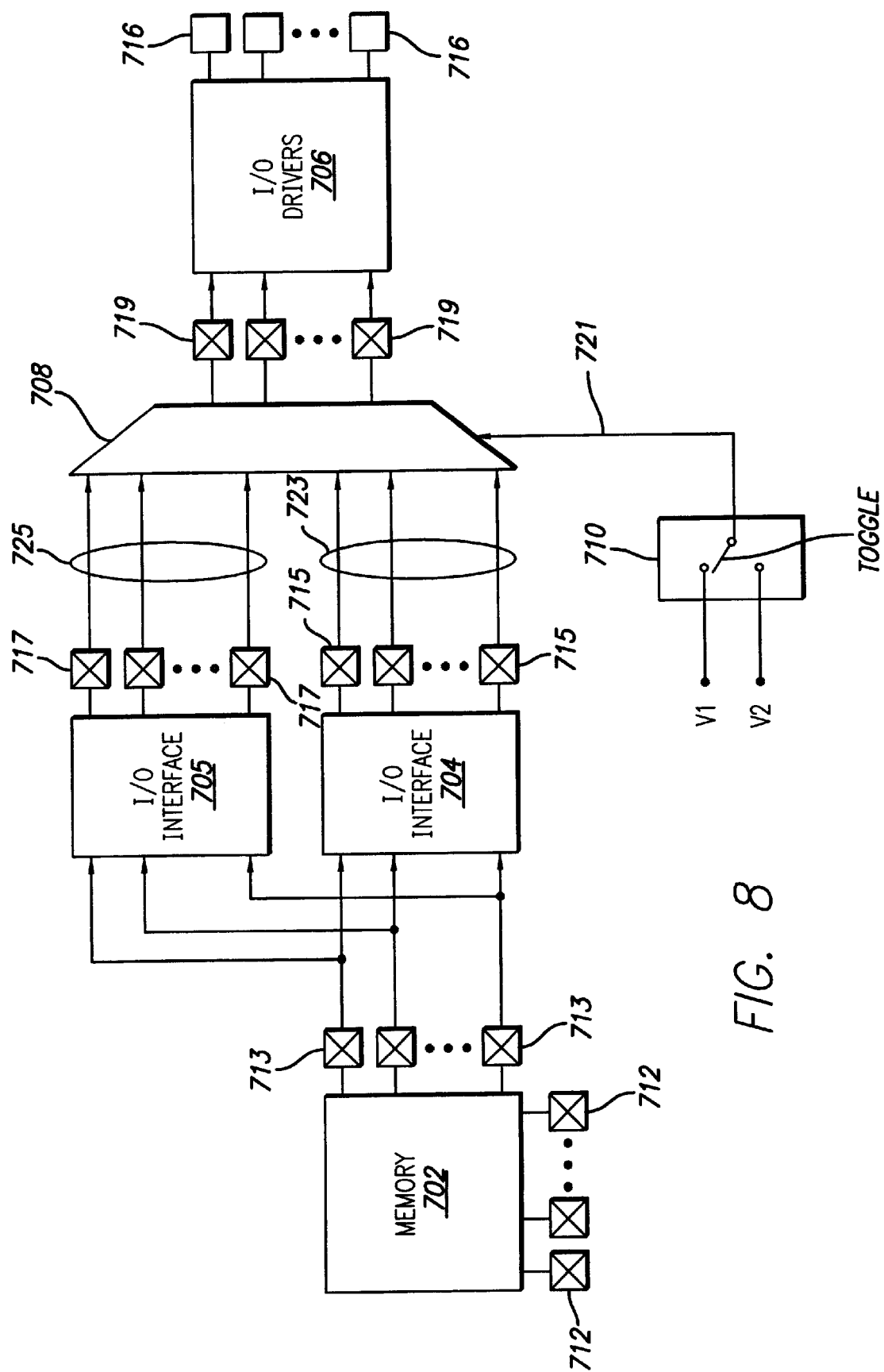
FIG. 8 is a block diagram one embodiment of using special contact pads to isolate a faulty circuit block and enable a redundant circuit block.

Special contact pads may also be used to not only isolate failures, but to also enable redundant circuits to be used to replace faulty circuits. FIG. 8 shows one embodiment of using special contact pads to identify faulty circuit blocks and enable a redundant circuit to replace the faulty circuit block. This embodiment again uses the example of accessing data in an embedded memory, but can be extended to a series of circuits in which one of the circuits has a redundant circuit.

FIG. 8 includes a redundant I/O interface 705 that can replace a defective I/O interface 704. The outputs of memory 702 are provide to both of I/O interfaces 704 and 705. The outputs of I/O interface 704 can be monitored through special contact pads 715, and the outputs of redundant I/O interface 705 can be monitored through special contact pads 717. If the outputs of I/O interface 704 are as expected indicating that I/O interface 704 is operating correctly, multiplexer 708 is configured by the control signal on line 721 to allow the signals on lines 723 to be provided to I/O drivers 706. If, however, the outputs of I/O interface 704 are not as expected indicating that I/O interface 704 is malfunctioning, and the outputs of redundant I/O interface 705 are as expected, then multiplexer 708 is configured by the control signal on line 721 to allow the signals on lines 725 to be provided to I/O drivers 706. The signals output by multiplexer 708 may be monitored via special contact pads 719.

The control signal on line 721 can be driven to the appropriate voltage level or logic state by switch 710. In response to a TOGGLE signal, either voltage V1 or V2 will be selected in response to monitoring the signals at the special contact pads 717 and 715. The TOGGLE signal can be controlled by another special contact pad (not shown).

Figure 9:
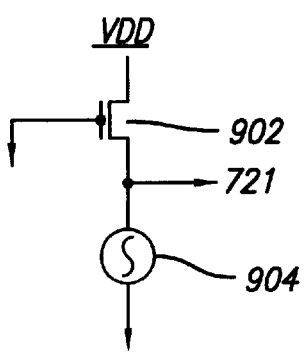
FIG. 9 is a circuit diagram of one embodiment of the switch of FIG. 8.

FIG. 9 shows switch 910 that is one embodiment of switch 710 of FIG. 7. Other embodiments of switch 710 may also be used. Switch 910 includes a PMOS transistor biased into an on-state by having its gate coupled to ground, its source coupled to a power supply VDD, and its drain coupled to signal line 721. Switch 910 also includes a fuse element 904 that is coupled between signal line 721 and ground. The fuse element may be a metal fuse, resistive fuse, or memory element. When fuse 904 is blown in response to the TOGGLE signal, signal line 721 is pulled towards VDD and the signals on lines 725, for example, are output by multiplexer 708. When fuse 904 is not blown, signal line 721 is pulled towards to ground by fuse 904 and the signals on lines 723, for example, are output by multiplexer 708. Fuse 904 may be blown using several well-known techniques including using a laser pulse or electrical currents. For one embodiment, a special test pad may be used to provide an electrical current that blows fuse 904.

Figure 10:
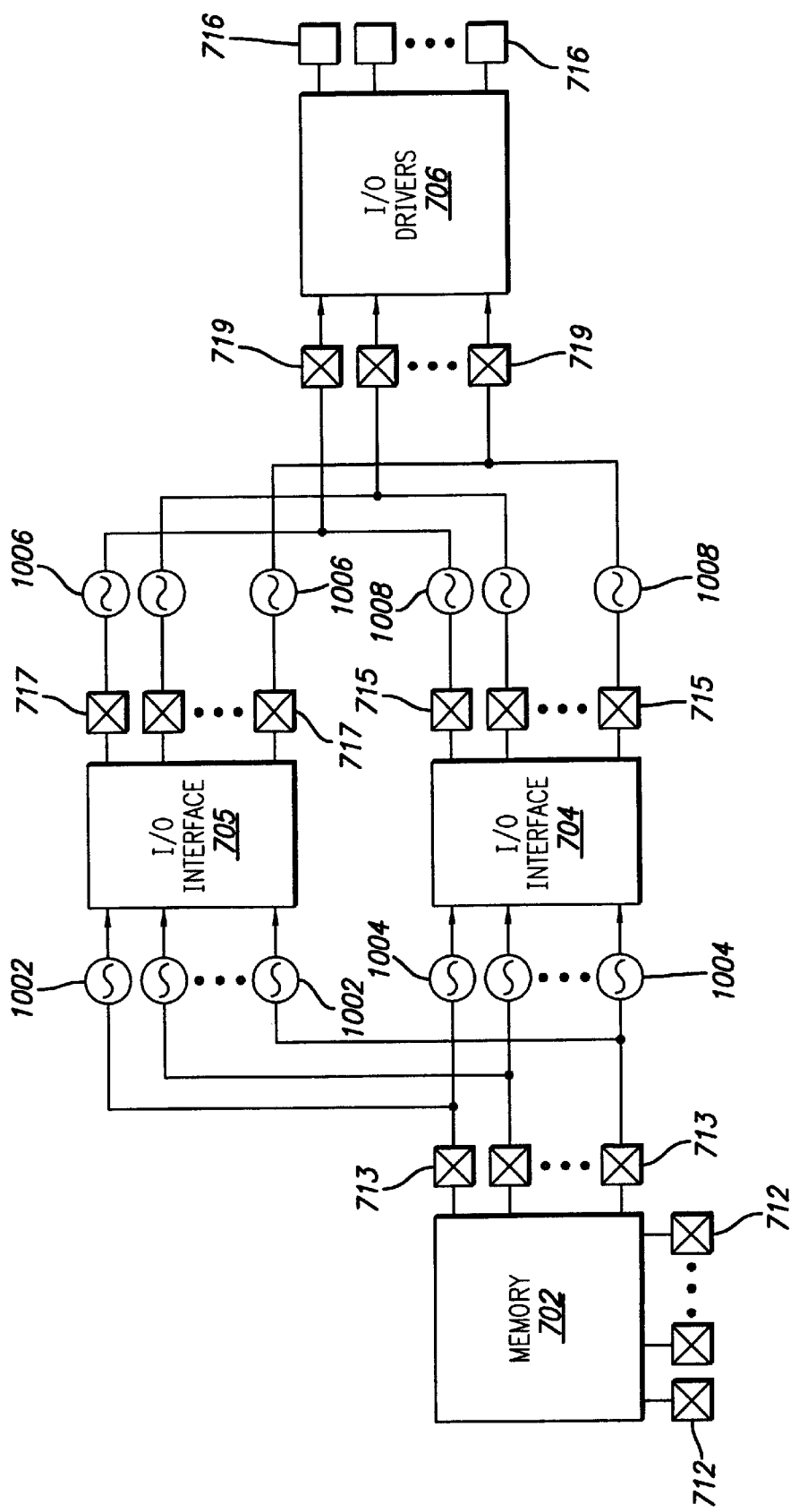
FIG. 10 is a block diagram of another embodiment of using special contact pads to isolate a faulty circuit block and enable a redundant circuit block.

FIG. 10 shows an alternative embodiment of the redundancy scheme of FIG. 8. In FIG. 10, groups of fuses 1002, 1004, 1006, and 1008 may be included before and after the I/O interfaces. When one of the I/O interface is identified as defective it may be isolated by an appropriate fuse group. For example, if I/O interface 704 is defective and I/O interface 705 is functioning correctly, then fuse groups 1004 and 1008 may be blown so as to isolate I/O interface 704. The fuse groups 1004 and 1008 may be blown via special contact pads (not shown) that provide one or more signals that cause a large amount of current to flow through fuse groups 1004 and 1008. Alternative means to blow the fuses may also be used.

Figure 11:
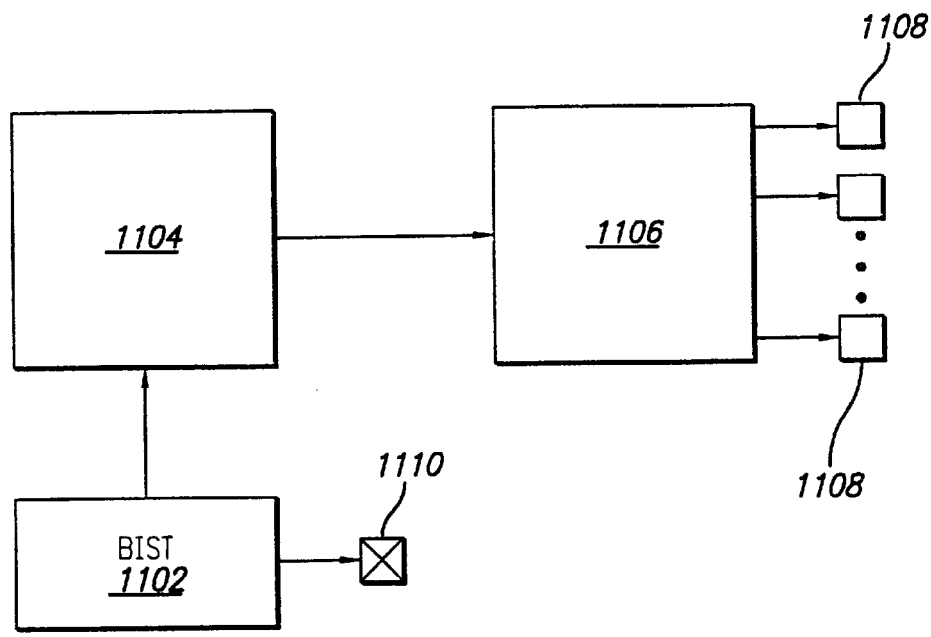
FIG. 11 is a block diagram of one embodiment of using a special contact pad to enable or stimulate a circuit under test.

As discussed above with respect to FIG. 1, special contact pads can be used together with on-chip test circuitry to test an integrated circuit. FIG. 11 shows one embodiment in which one (or more) special contact pad 1110 is used to provide a dock signal, reset signal, enable signal, or other control signal to BIST 1102. In response, BIST 1102 provides one or more test signals to internal circuit 1104 and/or internal circuit 1106. The results of the internal test may then be monitored at bond pads 1108 (or alternatively at other special contact pads). For other embodiments, a special contact pad may also be used to provide an enable signal or a clock signal to any other internal circuit.

Figure 12:
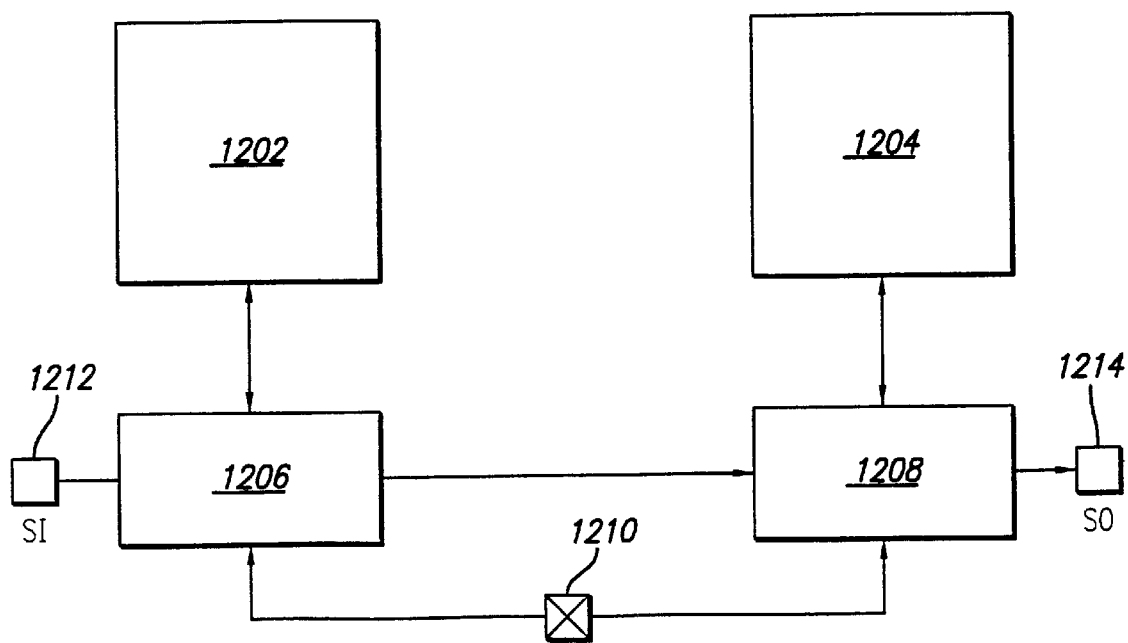
FIG. 12 is a block diagram of one embodiment of using a special contact pad to provide a control signal to scan circuitry.

Similarly, as shown in FIG. 12, one (or more) special contact pad 1210 may be used to provide a clock signal, reset signal, enable signal, or other control signal to shift register elements 1206 and 1208 of a SCAN circuit. The SCAN circuit may be coupled between bond pads 1212 and 1214 (or, alternatively, one or more special contact pads) that may receive SCAN input data (SI), and provide SCAN output data (SO), respectively.

For an alternative embodiment, one or both of pads 1212 may be special contact pads. This may provide for increased design flexibility in the location and use of SCAN circuity. For example, this may enable multiple SCAN regions or circuits of varying size and complexity to test various different internal circuits or blocks of circuits.

When the special contact pads are available on a die of a wafer, test signals may be supplied to special contact pads, or signals may be monitored at the special contact pads by means of test or probe card assemblies. Probe card assemblies typically include a probe card that has a number of probe elements or contact structures to contact the special contact pads and bond pads. A host controller or other logic device typically communicates with the integrated circuit under test through the probe card.

Figure 13:
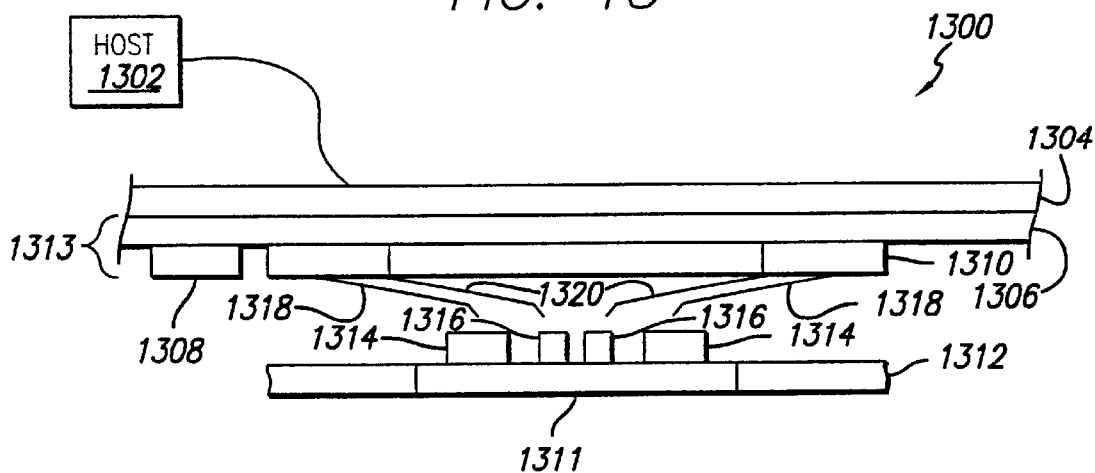
FIG. 13 is a side cross-sectional view of one embodiment of a probe card assembly having a probe card with cantilevered probes for probing bond pads and special contact pads of an integrated circuit.

FIG. 13 illustrates one embodiment of an test system 1300 for performing a wafer-level sort test of a die 1311 that includes bond pads 1314 and special contact pads 1316. Die 1311 is formed on wafer 1312 that may be disposed on a suitable support structure such as a vacuum chuck (not shown). Die 1311 may embody an integrated circuit such as integrated circuit 100 of FIG. 1.

System 1300 includes a test head 1304 and a probe card assembly 1313. Probe card assembly 1313 includes a load board or interconnection substrate 1306 and cantilevered or needle probe card 1310. Host 1302 communicates test signals with test head 1304. Any type of host may be used including a personal computer, or specialized machines such as Automatic Test Equipment (ATE) provided by LTX, Credence, Teradyne, and others. Test head 1304 typically includes drivers, receivers, and parametric measuring units (PMUs) that communicate signals with load board 1306 and probe card 1310. Load board 1306 is typically a PCB that provides the appropriate mechanical interconnection and load circuits for probe card 1310. In alternative embodiments, load board 1310 may be omitted. Load board 1310 may also include control logic such as logic 1308. Control logic 1308 may be an application-specific IC (ASIC) used to provide tests to die 1311 under the control of host 1302.

Probe card 1310 is a cantilevered or needle probe card that includes cantilevered probes 1318 and 1320 that provide signals to and receive signals from die 1311. Probes 1318 and 1320 may comprise any suitable conductive material including tungsten. As shown in the plan view of probe card 1310 in FIG. 14, probes 1318 and 1320 are connected to contact pins or points 1322 that contact load board 1306 or test head 1304.

Figure 14:
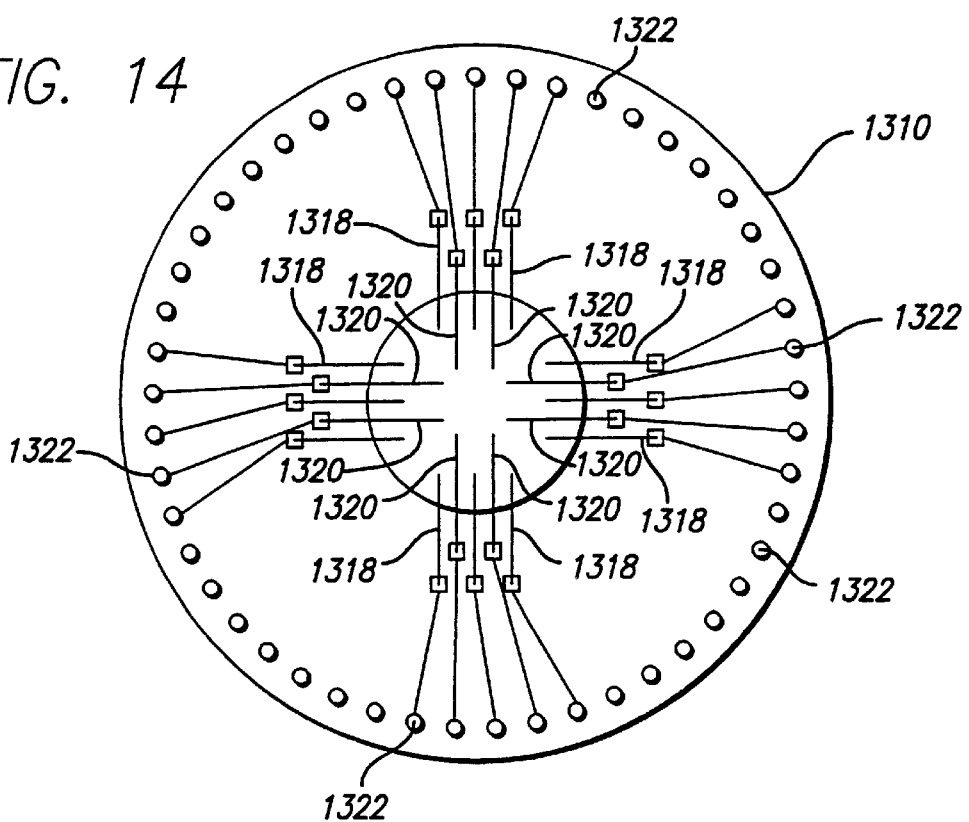
FIG. 14 is a plan view of the probe card of FIG. 13.

Probes 1318 are provided in a predetermined alignment to contact bond pads 1314. As shown in FIG. 14, probes 1318 make a relatively rectangular shape. Probes 1320 are provided to contact special contact pads 1316 of die 1311. Probes 1320 are generally not disposed in the same predetermined alignment of the probes 1318; rather, they extend into the region surrounded by probes 1318 (and bond pads 1314). In alternative embodiments, probes 1320 may exist outside of the region surrounded by probes 1318, or they may be disposed in the same predetermined alignment with probes 1318 and bond pads 1314.

In another embodiment, probes 1318 may be arranged in a lead-on-center arrangement to align with lead-on-center bond pads on a die, and probes 1320 may be arranged outside the lead-on-center arrangement to align with corresponding special contact pads.

While FIGS. 13 and 14 show that a single probe card and probe card assembly may be used to communicate with special contact pads 1316 and bond pads 1314, in alternative embodiments, separate probe cards may be used for probing special contact pads 1316 and bond pads 1314. That is, one or more probe cards may be used to contact only bond pads 1314 with one or more of probes 1318, and one or more additional probe cards may be used to contact special contact pads 1316 with one or more probes 1320. In still other embodiments, multiple probe cards may be used that have a mixture of probes 1318 and 1320.

For an alternative embodiment, bond pads 1316 and special contact pads 1316 may be of different heights. For example, bond pads 1314 may be taller than special contact pads 1316 (or vice versa). For this embodiment, probes 1318 and 1320 may extend to different depths. That is, probes 1320 may extend lower than probes 1318 to make contact with special contact pads 1316.

FIG. 15 illustrates test system 1500 that is another embodiment for performing a wafer-level sort test of a die 1511 that includes bond pads 1514 and special contact pads 1516. Die 1511 is formed on wafer 1512 that may be disposed on a suitable support structure such as a vacuum chuck (not shown). Die 1511 may embody an integrated circuit such as those described with respect to FIGS. 1–6.

System 1500 includes a test head 1504 and a probe card assembly 1513. Probe card assembly 1513 includes a load board or interconnection substrate 1506 and membrane probe card 1510. Like host 1302 of FIG. 13, host 1502 communicates test signals with test head 1504. Test head 1504 typically includes drivers, receivers, and parametric measuring units (PMUs) that communicate signals with load board 1506 and probe card 1510. Load board 1506 is a PCB that typically provides the appropriate mechanical interconnection and load circuits for probe card 1510. In alternative embodiments, load board 1510 may be omitted. Load board 1510 may also include control logic such as logic 1508. Control logic 1508 may be an ASIC used to provide tests to die 1511 under the control of host 1502.

Probe card 1510 is a membrane probe card that includes contact balls 1518 and 1520 that provide signals to and receive signals from die 1511. Contact balls or probes 1518 and 1520 may comprise any suitable conductive material including solder.

Probes 1518 are provided in a predetermined alignment to contact bond pads 1514. As shown in FIG. 16, probes 1518 may be arranged in a grid array to contact bond pads 1514 arranged in a correspond grid array pattern. Probes 1520 may be aligned in the predetermined grid array, outside of the grid array pattern, or interspersed within the grid array pattern as shown in FIG. 16 to align with corresponding special contact pads 1516 on die 1511. Alternatively, as shown in FIG. 17, probes 1518 may be arranged in a peripheral pattern to contact bond pads 1514 arranged on die 1511 in a corresponding peripheral pattern. Probes 1520 may be aligned in the predetermined peripheral pattern, outside of the peripheral pattern, or within the peripheral pattern as shown in FIG. 17 to align with corresponding special contact pads 1516 on die 1511. In yet another embodiment, probes 1518 may be arranged in a lead-on-center arrangement to align with lead-on-center bond pads on a die, and probes 1520 may be arranged within or outside of the lead-on-center arrangement to align with corresponding special contact pads.

While FIGS. 15–17 show that a single probe card and probe card assembly may be used to communicate with special contact pads 1516 and bond pads 1514, in alternative embodiments, separate probe cards may be used for probing special contact pads 1516 and bond pads 1514. That is, one or more probe cards may be used to contact only bond pads 1514 with one or more of probes 1518, and one or more additional probe cards may be used to contact special contact pads 1516 with one or more probes 1520. In still other embodiments, multiple probe cards may be used that have a mixture of probes 1518 and 1520.

For an alternative embodiment, bond pads 1516 and special contact pads 1516 may be of different heights. For example, bond pads 1514 may be taller than special contact pads 1516 (or vice versa). For this embodiment, probes 1518 and 1520 may have different heights. That is, probes 1520 may extend lower than probes 1518 to make contact with special contact pads 1516.

FIG. 18 illustrates test system 1800 that is another embodiment for performing a wafer-level sort test of a die 1811 that includes bond pads 1814 and special contact pads 1816. Die 1811 is formed on wafer 1812 that may be disposed on a suitable support structure such as a vacuum chuck (not shown). Die 1811 may embody an integrated circuit such as those described with respect to FIGS. 1–6.

System 1800 includes a test head 1804 and a COBRA-style probe card assembly 1813. The COBRA-style probe card assembly is available from Wentworth Laboratories of Brookfield Conn. The COBRA-style probe card assembly includes a load board or interconnection substrate 1806, space transformer (either wired or ceramic) 1808, and head assembly 1807. Head assembly 1807 includes upper plate 1809, spacer 1810, lower plate 1811, and COBRA-style probes 1818 and 1820. Like host 1302 of FIG. 13, host 1802 communicates test signals with test head 1804. Test head 1804 typically includes drivers, receivers, and parametric measuring units (PMUs) that communicate signals with load board 1806 and probe card assembly 1813. Load board 1806 is a PCB that typically provides the appropriate mechanical interconnection and load circuits for probe card assembly 1813. In alternative embodiments, load board 1810 may be omitted. Load board 1810 may also include control logic to provide tests to die 1811 under the control of host 1802.

Probes 1818 are provided in a predetermined alignment to contact bond pads 1814. As shown in FIG. 19, probes 1818 may be arranged in a grid array to contact bond pads 1814 aligned in a corresponding grid array pattern. Probes 1820 may be arranged with the predetermined grid array, outside of the grid array pattern, of interspersed within the grid array pattern as shown in FIG. 19 to align with corresponding special contact pads 1816 on die 1811. Alternatively, as shown in FIG. 20, probes 1818 may be arranged in a peripheral pattern to contact bond pads 1814 arranged on die 1811 in a corresponding peripheral pattern. Probes 1820 may be aligned in the predetermined peripheral pattern, outside of the peripheral pattern, or within the peripheral pattern as shown in FIG. 20 to align with corresponding special contact pads 1816 on die 1811. In yet another embodiment, probes 1818 may be arranged in a lead-on-center arrangement to align with lead-on-center bond pads on a die, and probes 1820 may be arranged within or outside of the lead-on-center arrangement to align with corresponding special contact pads.

While FIGS. 18–20 show that a single probe card assembly may be used to communicate with special contact pads 1816 and bond pads 1814, in alternative embodiments, separate probe card assemblies may be used for probing special contact pads 1816 and bond pads 1814. That is, one or more probe card assemblies may be used to contact only bond pads 1814 with one or more of probes 1818, and one or more additional probe card assemblies may be used to contact special contact pads 1816 with one or more probes 1820. In still other embodiments, multiple probe card assemblies may be used that have a mixture of probes 1818 and 1820.

For an alternative embodiment, bond pads 1816 and special contact pads 1816 may be of different heights. For example, bond pads 1814 may be taller than special contact pads 1816 (or vice versa). For this embodiment, probes 1818 and 1820 may extend to different depths (or have different heights). That is, probes 1820 may extend lower than probes 1818 to make contact with special contact pads 1816.

FIG. 21 illustrates test system 2100 that is another embodiment for performing a wafer-level sort test of a die 2111 that includes bond pads 2114 and special contact pads 2116. Die 2111 is formed on wafer 2112 that may be disposed on a suitable support structure such as a vacuum chuck (not shown). Die 2111 may embody an integrated circuit such as those described with respect to FIGS. 1–6.

Apparatus 2100 includes a test head 2104 and a probe card assembly 2113 such as that provided by FormFactor, Inc. of Livermore, Calif. One embodiment of probe card assembly 2113 is disclosed in U.S. patent application Ser. No. 08/789,147 filed on Jan. 24, 1997, which is incorporated by reference herein. Probe card assembly 2113 generally includes probe card 2106, interposer 2108, space transformer 2108, and spring contact elements 1218 and 1220. Like host 1302 of FIG. 13, host 2102 communicate test signals with test head 2104. Test head 2104 typically includes drivers, receivers, and parametric measuring units (PMUs) that communicate signals with probe card assembly 2113. Probe card assembly 2113 may also include control logic to provide tests to die 2111 under the control of host 2102.

Spring contact elements 2118 are formed in a predetermined alignment to contact bond pads 2114. Probes 2118 may be arranged in a grid array to contact bond pads 2114 aligned in a corresponding grid array pattern. Spring contact elements 2120 may be arranged with the predetermined grid array, outside of the grid array pattern, or interspersed within the grid array pattern to align with corresponding special contact pads 2116 on die 2111. Alternatively, spring contact elements 2118 may be arranged in a peripheral pattern to contact bond pads 2114 arranged on die 2111 in a corresponding peripheral pattern. Spring contact elements 2120 may be aligned in the predetermined peripheral pattern, outside of the peripheral pattern, or within the peripheral pattern to align with corresponding special contact pads 2116 on die 2111. In yet another embodiment, spring contact elements 2118 may be arranged in a lead-on-center arrangement to align with lead-on-center bond pads on a die, and spring contact elements 2120 may be arranged within or outside of the lead-on-center arrangement to align with corresponding special contact pads.

While FIG. 21 shows that a single probe card assembly may be used to communicate with special contact pads 2116 and bond pads 2114, in alternative embodiments, separate probe card assemblies may be used for probing special contact pads 2116 and bond pads 2114. That is, one or more probe card assemblies may be used to contact only bond pads 2114 with one or more of spring contact elements 2118, and one or more additional probe card assemblies may be used to contact special contact pads 2116 with one or more spring contact elements 2120. In still other embodiments, multiple probe card assemblies may be used that have a mixture of spring contact elements 2118 and 2120.

For an alternative embodiment, bond pads 2116 and special contact pads 2116 may be of different heights. For example, as shown in FIG. 22, bond pads 2114 may be taller than special contact pads 2116 (or vice versa). For this embodiment, probes 2118 and 2120 are extended to different depths (or have different heights). That is, probes 2120 may extend lower than probes 2118 to make contact with special contact pads 2116.

For an alternative embodiment, as shown in FIG. 23, spring contact elements 2118 and 2120 may be attached to bond pads 2114 and special contact pads 2116 on die 2111. For this embodiment, space transformer 2110 may include pads 2120 to make contact with the spring contact elements 2118 and 2120. For yet another embodiment, some of the spring contact elements 2118 or 2120 may attached to space transformer 2110 and some may be attached to die 2111.

Figure 24:
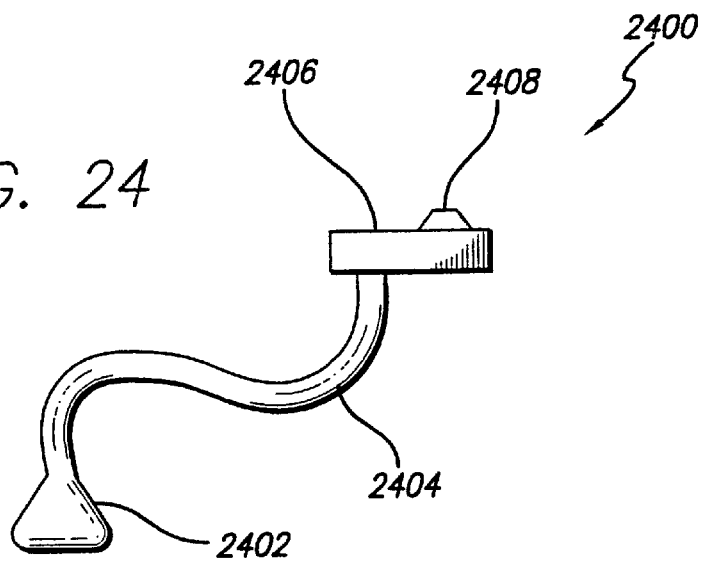
FIG. 24 is a side cross-sectional view of one embodiment of a spring contact element of FIG. 21.

FIG. 24 shows a side cross-sectional view of spring contact element 2400 that is one embodiment of the spring contact elements 2118 and 2120 of FIGS. 21–23. Spring contact element 2400 includes a base 2402, elongated resilient member 2404, an elongated contact tip structure 2406, and a pyramid-shaped contact feature 2408. Many other embodiments of spring contact elements may be used including those disclosed in commoly-owned co-pending U.S. application Ser. No. 08/526,246 filed on Sep. 21, 1995, commonly-owned, co-pending U.S. application Ser. No. 08/558,332 filed on Nov. 15, 1995, commonly-owned, co-pending U.S. application Ser. No. 08/789,147 filed on Jan. 24, 1997, commonly-owned, co-pending U.S. application Ser. No. 08/819,464 filed on Mar. 17, 1997, commonly-owned, co-pending U.S. application Ser. No. 09/189,761 filed on Nov. 10, 1998, which are all incorporated by reference herein.

Figure 25:
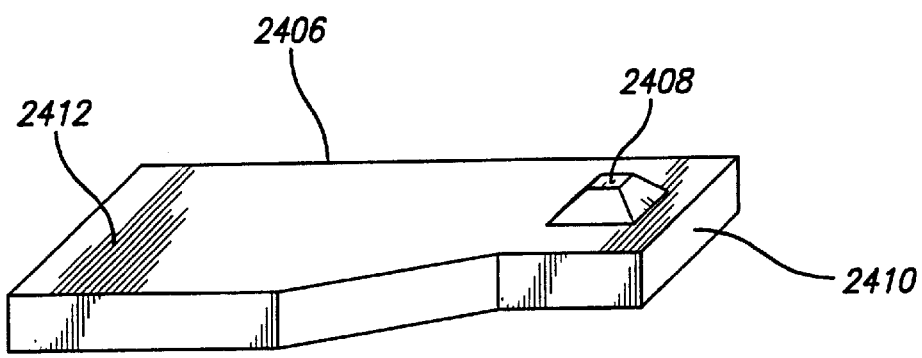
FIG. 25 a perspective view of one embodiment of the contact tip structure and pyramid-shaped contact feature of the spring contact element of FIG. 21.

Structure 2406 can be any shape. FIG. 25 shows one embodiment of structure 25 which includes a relatively wider end for contacting to member 2404, and a relatively narrower end for supporting pyramid-shaped contact feature 2408.

Figure 26:
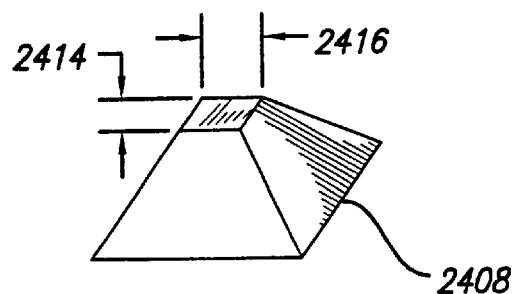
FIG. 26 is a perspective view of one embodiment of the pyramid-shaped contact tip structure of FIG. 25.

FIG. 26 shows one embodiment of pyramid-shaped contact feature 2408. Other shapes may be used. Feature 2408 is advantageously be significantly smaller than typical tungsten probe tips of cantilevered probes and contact balls of C4 of flip-chip probe card technologies. The tip of pyramid-shaped contact feature 2408 may have a length 2414 and width 2416 dimensions of approximately 1 to 5 µm. For alternative embodiments, 2414 and 2416 may be submicron dimensions. The small size of contact 2408 may allow for special contact pads to be smaller that bond pads. As previously discussed, when the special contact pads are smaller that the bond pads, then the special contact pads can be added to an integrated circuit without increasing the die size. Additionally, smaller special contact pads can be placed between bond pads.

FIGS. 29A and 29B show side and perspective views, respectively, of another embodiment of a spring contact element disclosed in U.S. application Ser. No. 09/189,761. Spring contact element 2900 is coupled to a substrate 2906 and includes an elongated resilient member 2904, tip structure 2908, and blade 2902. Blade 2902 is used to make electrical contact to bond pads or special contact pads. Blade 2902 may advantageously be used to provide a good electrical connection to contacted bond or special contact pads as blade 2902 may cut, slice, or otherwise penetrate the top surface of the pad. Blade 2902 may be disposed substantially horizontally on tip structure 29A, or in any other orientation.

FIGS. 30A and 30B show perspective and side views, respectively, of another embodiment of using blades on tip structures of spring contact elements. Blade 3000 is a multi-height blade disposed on tip structure 3006. Blade 3000 has a primary blade 3002 toward the front edge of tip structure 3006, and a trailing blade 3004 toward the back of tip structure 3006.

FIG. 31 shows a perspective view of another blade structure formed on a tip structure 3100. The blade of FIG. 31 is formed having a substantially rectangular base 3102 and a substantially triangular shape 3104.

Figure 27:
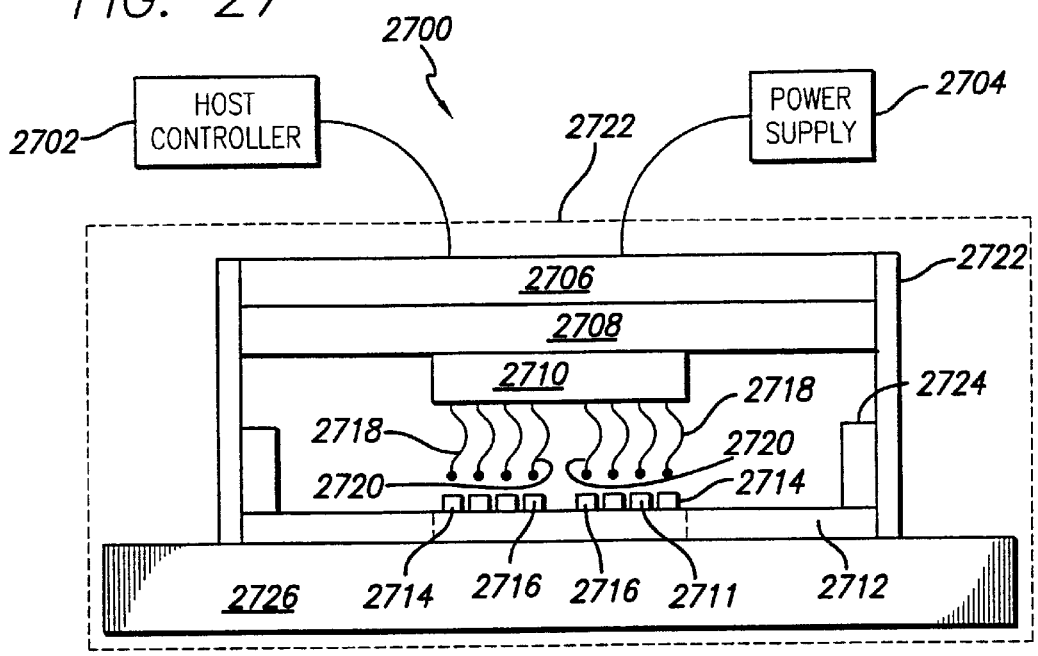
FIG. 27 is a side cross-sectional view of another embodiment for performing wafer-level test of an integrated circuit having bond pads and special contact pads.

FIG. 27 illustrates test system 2700 that is another embodiment for performing a wafer-level sort test of a die 2711. One embodiment of apparatus 2700 for testing more than one die at a time is described in commonly-owned, co-pending U.S. patent application Ser. No. 08/784,862 filed on Jan. 15, 1997, which is incorporated herein by reference.

Die 2711 includes bond pads 2714 and special contact pads 2716. Wafer 2712 includes die 2711 and may be disposed on a suitable support structure such as vacuum chuck 2726. Die 2711 may embody an integrated circuit such as integrated circuit 100 of FIGS. 1–6.

System 2700 includes a support chuck 2704 and a probe card assembly or test substrate. The probe card assembly includes an interconnection substrate (base plate) 2708, an active electronic component 2710, and spring contact element 2718 and 2720. Component 2710 includes circuitry for applying test signals to, and monitoring the test output from, die 2711. For one embodiment, component 2710 may be an application-specific integrated circuit (ASIC).

Like host 1302 of FIG. 13, host 2702 communicates test signals with the probe card assembly. For one embodiment, host 2702 communicates test signals with component 2710 via interconnection substrate 2708. Power may be provided to component 2710 from power supply 2704.

System 2700 also includes guide pins 2722 disposed around the periphery of wafer 2712 and the probe card assembly to ensure accurate alignment when spring contact elements 2718 and 2720 are urged into contact with bond pads 2714 and special contact pads 2716, respectively. A compression stop (block ring) 2724, which may be suitably disposed on the face of wafer 2712, limits the amount of travel or distance that the tips of the spring contact elements 2718 and 2720 will deflect when urged against the pads of die 2711.

Spring contact elements 2718 are formed in a predetermined alignment to contact bond pads 2714. Probes 2718 may be arranged in a grid array to contact bond pads 2714 arranged on die 2711 in a corresponding grid array pattern. Spring contact elements 2720 may be aligned in the predetermined grid array, outside of the grid array pattern, or interspersed within the grid array pattern to align with corresponding special contact pads 2716. Alternatively, spring contact elements 2718 may be arranged in a peripheral pattern to contact bond pads 2714 arranged on die 2711 in a corresponding peripheral pattern. Spring contact elements 2720 may be arranged with the predetermined peripheral pattern, outside of the peripheral pattern, or within the peripheral pattern to align with corresponding special contact pads 2716. In yet another embodiment, spring contact elements 2718 may be arranged in a lead-on-center arrangement to align with lead-on-center bond pads on a die, and spring contact elements 2720 may be arranged within or outside of the lead-on-center arrangement to align with corresponding special contact pads.

While FIG. 27 shows that a single probe card assembly may be used to communicate with special contact pads 2716 and bond pads 2714, in alternative embodiments, separate probe card assemblies may be used for probing special contact pads 2716 and bond pads 2714. That is, one or more probe card assemblies may be used to contact only bond pads 2714 with one or more of spring contact elements 2718, and one or more additional probe card assemblies may be used to contact special contact pads 2716 with one or more spring contact elements 2720. In still other embodiments, multiple probe card assemblies may be used that have a mixture of spring contact elements 2718 and 2720.

For an alternative embodiment, bond pads 2716 and special contact pads 2716 may be of different heights. For example, bond pads 2714 may be taller than special contact pads 2716 (or vice versa). For this embodiment, probes 2718 and 2720 are extended to different depths (or have different heights). That is, probes 2720 may extend lower than probes 2718 to make contact with special contact pads 2716.

For an alternative embodiment, spring contact elements 2718 and 2720 may be attached to bond pads 2714 and special contact pads 2716 on die 2711. For this embodiment, component 2710 may include pads to make contact with the spring contact elements. For yet another embodiment, some of the spring contact elements 2718 or 2720 may be attached to component 2710 and some may be attached to die 2711.

As previously described above, special contact pads can be disposed on a die or on packages such as Land Grid Array (LGA) packages. When special contact pads are disposed on packages or on devices arranged in a C4 or flip-chip configuration, they can provide a means for supplying test signals or programming signals to the special contact pad of the die. This may be advantageous to allow, for example, field programming of packaged programmable logic device or nonvolatile devices without having to provide dedicated bonded out pins for the programming function. Additionally, embedded nonvolatile memory arrays that store program code, application software, or BIOS may be updated in the field. Special contact pads disposed on a package may also provide an advantageous means for testing a faulty device and programming redundant circuits to replace a faulty circuit as described above with respect to FIGS. 8–10.

Figure 28:
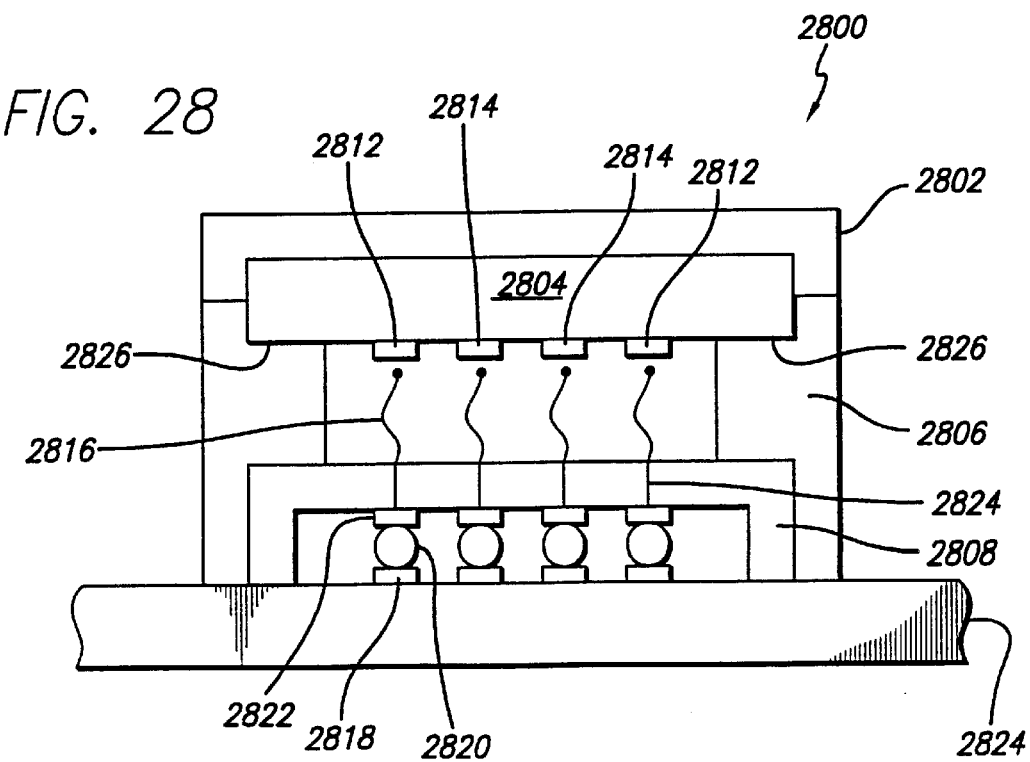
FIG. 28 is a side cross-sectional view of one embodiment of a socket for retaining a package having special contact points and conventional input, output, and input/output pins.

FIG. 28 illustrates one embodiment of solder-down (surface mount) LGA socket 2800 for mounting to a printed circuit board (PCB) substrate 2810 and for making pressure contacts to bond pads 2812 and special contact pads 2814 of LGA package 2804. As used herein, the term "socket" refers to an electronic component having interconnection elements, suitable for making electrical connection to terminals or connection points of another electronic component. The socket shown in FIG. 28 is intended to permit a semiconductor package to be removably connected to a circuit board. Other embodiments of socket 2800 are disclosed in commonly-owned U.S. Pat. No. 5,772,451 which is incorporated herein by reference.

PCB 2810 has a plurality of terminals or pads 2818, and package 2804 have a plurality of bond pads 2812 and special contact pads 2814. Socket 2800 provides a means for electrically interconnecting terminals 2818 with pads 2812 and 2814. Circuitry provided on PCB 2810, or in communication therewith, may provide signals to or monitor signals from pads 2812 and 2814 through socket 2800. For example, programmable circuitry within package 2804 may be programmed or monitored through spring contact elements 2816, special contact pads 2814 and/or pads 2812.

Socket 2800 includes a support substrate 2808 formed, for example, from a conventional PCB material. Support substrate 2808 includes spring contact elements 2816 formed on a top surface thereof, and pads 2822 formed on a bottom surface thereof. Spring contact elements 2816 are for contacting pads 2812 and 2814 of package 2804 when package 2804 is urged downward by a forced applied to the topside of package 2804 by retaining means 2802. Other contact elements besides spring contact elements may also be used. Support substrate 2808 also includes electrical conduits 2824 that provide an electrical interconnection between spring contact elements 2816 and pads 2822. For an alternative embodiment, spring contact elements 2816 may be connected directly to terminals 2818.

Contact balls (such as conventional solder balls) are disposed on the bottom surface of pads 2822. The contact balls 2822 serve as contact structures disposed on the bottom surface of the support substrate 2808 to contact corresponding pads or terminals 2818 on PCB 2810. Other electrical contact structures may also be used.

Socket 2800 also includes a frame 2806 that is attached to PCB 2802. Frame 2806 includes landings 2826 to support package 2804. Socket 2800 also includes retaining means 2802 that is disposed over frame 2826 and package 2804. Retaining means 2802 retains package 2804 on landings 2826 such that spring contact elements 2816 remain in electrical contact with pads 2812 and 2814. Any suitable mechanical means may be used for retaining means 2802 including, for example, a spring clip.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A socket for releasably connecting a first electronic component to a second electronic component, comprising:
   a first plurality of resilient contact structures extending from a surface of a support substrate, the first plurality of resilient contact structures configured to make electrical connections with a plurality of bond pads disposed in a first predetermined pattern on the first electronic component;
   a second plurality of resilient contact structures extending from the surface of the support substrate, the second plurality of resilient contact structures configured to make electrical connections with a plurality of special contact pads disposed in a second predetermined pattern on the first electronic component, wherein said special contact pads are smaller than said bond pads; and a plurality of contact structures disposed on another surface of the support substrate for making electrical contact with said second electronic component, ones of the contact structures are connected to ones of the first plurality of resilient contact structures, and ones of the contact structures are connected to ones of the second plurality of resilient contact structures.

2. The socket of claim 1, wherein the second electronic component is a circuit board.

3. The socket of claim 1, further comprising means for receiving the first electronic component.

4. The socket of claim 1, further comprising means for urging the first electronic component down onto the first and second resilient contact structures.

5. The socket of claim 1, wherein said first electronic component is an integrated circuit.

6. The socket of claim 1, wherein said first electronic component comprises:

a plurality of first input/output buffers each electrically connected to one of said bond pads; and a plurality of second input/output buffers each electrically connected to one of said special contact pads, wherein each of said second input/output buffers is smaller than each of said first input/output buffers.

7. The socket of claim 1, wherein said first electronic component comprises:

a plurality of first electrostatic discharge protection circuits each electrically connected to one of said bond pads; and a plurality of second electrostatic discharge protection circuits each electrically connected to one of said special contact pads, wherein each of said second electrostatic discharge protection circuits is smaller than each of said first electrostatic discharge protection circuits.

8. The socket of claim 1, wherein a height from a surface of said first electronic component of each of said special contact pads is less than a height from said surface of each of said bond pads.

9. The socket of claim 8, wherein said second plurality of resilient contact structures extend farther from said top surface of said support substrate than said second plurality of resilient contact structures.

10. The socket of claim 9, wherein an amount by which said second plurality of resilient contact structures extend farther from said top surface of said support substrate than said second plurality of resilient contact structures corresponds to an amount by which said height from said surface of said first electronic component of each of said special contact pads is less than said height from said surface of each of said bond pads.

11. The socket of claim 1, wherein each of said first plurality of resilient contact structures comprises a blade tip.

12. A socket comprising:

a substrate;

a first plurality of resilient contact means for making electrical connections between terminals on a first surface of said substrate and bond pads disposed in a first predetermined pattern on a first electronic component;

a second plurality of resilient contact means for making electrical connections between terminals on said first surface of said substrate and special contact pads disposed in a second predetermined pattern on said first electronic component, wherein said special contact pads are smaller than said bond pads;

a third plurality of contact means for making electrical connections between terminals on a second surface of said substrate and a second electronic component;

means for electrically connecting ones of said first plurality of contact means with ones of said third plurality of contact means;

means for electrically connecting ones of said second plurality of contact means with ones of said third plurality of contact means; and means for urging said first electronic component against said first plurality of resilient contact means and said second plurality of resilient contact means.

13. The socket of claim 12, wherein the second electronic component is a circuit board.

14. The socket of claim 12, wherein said first electronic component is an integrated circuit.

15. The socket of claim 12, wherein said first electronic component comprises:

a plurality of first buffer means for buffering signals through each of said bond pads; and a plurality of second buffer means for buffering signals through each of said special contact pads, wherein each of said second buffer means is smaller than each of said first buffer means.

16. The socket of claim 12, wherein said first electronic component comprises:

a plurality of first protection means for protecting said first electronic component from electrostatic discharge through each of said bond pads; and a plurality of second protection means for protecting said first electronic component from electrostatic discharge through each of said special contact pads, wherein each of said second protection means is smaller than each of said first protection means.

17. The socket of claim 12, wherein a height from a surface of said first electronic component of each of said special contact pads is less than a height from said surface of each of said bond pads.

18. The socket of claim 17, wherein said each of said second plurality of resilient contact means extends farther from said surface of said support substrate than each of said second plurality of resilient contact means.

19. The socket of claim 18, wherein an amount by which each of said second plurality of resilient contact means extends farther from said surface of said support substrate than each of said second plurality of resilient contact means corresponds to an amount by which said height from said surface of said first electronic component of each of said special contact pads is less than said height from said surface of each of said bond pads.

20. The socket of claim 12, wherein each of said first plurality of resilient contact means comprises a blade tip.

* * * * *